(12) United States Patent
Takemura

(10) Patent No.: US 6,335,551 B2
(45) Date of Patent: Jan. 1, 2002

(54) THIN FILM CAPACITOR HAVING AN IMPROVED BOTTOM ELECTRODE AND METHOD OF FORMING THE SAME

(75) Inventor: Koichi Takemura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/741,422

(22) Filed: Dec. 21, 2000

Related U.S. Application Data

(62) Division of application No. 09/185,586, filed on Nov. 4, 1998, now Pat. No. 6,218,233.

(30) Foreign Application Priority Data

Nov. 4, 1997 (JP) ............................................... 9-301701

(51) Int. Cl.[7] .......................................... H01C 27/108
(52) U.S. Cl. ..................... 257/306; 257/298; 257/52; 257/295; 257/532; 257/300; 438/396
(58) Field of Search ............................. 257/310, 306, 257/52, 68, 532, 295, 298, 300; 361/278; 438/396

(56) References Cited

U.S. PATENT DOCUMENTS

| | | | | |
|---|---|---|---|---|
| 3,611,063 A | * | 10/1971 | Neale et al. ............ 317/234 R |
| 5,055,445 A | * | 10/1991 | Belt et al. ....................... 505/1 |
| 5,185,689 A | * | 2/1993 | Maniar ......................... 361/313 |
| 5,561,307 A | * | 10/1996 | Mihara et al. ............... 257/295 |
| 5,814,849 A | * | 9/1998 | Azuma et al. ............... 257/295 |
| 5,986,301 A | * | 11/1999 | Fukushima et al. ......... 257/306 |
| 6,128,178 A | * | 10/2000 | Newns ......................... 361/305 |
| 6,151,240 A | * | 11/2000 | Suzuki ......................... 365/145 |
| 6,197,719 B1 | * | 3/2001 | Choudhary et al. ......... 502/300 |
| 6,198,119 B1 | * | 3/2001 | Nabatame et al. .......... 257/295 |
| 6,201,276 B1 | * | 3/2001 | Agarwal et al. ............. 257/315 |

FOREIGN PATENT DOCUMENTS

| | | | |
|---|---|---|---|
| JP | 60-5131 | 1/1985 | |
| JP | 02046756 | * 2/1990 | ................. 438/396 |
| JP | 5-343345 | 12/1993 | |
| JP | 9-102591 | 4/1997 | |
| JP | 9-191087 | 7/1997 | |
| JP | 9-246490 | 9/1997 | |
| JP | 09260603 | * 10/1997 | |
| JP | 9-260603 | 10/1997 | |
| WO | WO 96/16447 | 5/1996 | |

* cited by examiner

*Primary Examiner*—Eddie Lee
*Assistant Examiner*—Eugene Lee
(74) *Attorney, Agent, or Firm*—Young & Thompson

(57) ABSTRACT

The present invention provides a storage electrode of a capacitor, which includes a region in contact with a dielectric film of the capacitor, wherein at least the region is made of an amorphous electrically conductive oxide material.

17 Claims, 19 Drawing Sheets

THIN FILM CAPACITOR HAVING AN IMPROVED BOTTOM ELECTRODE AND METHOD OF FORMING THE SAME

CROSS REFERENCE TO RELATED APPLICATIONS

This application is a division of application Ser. No. 09/185,586, filed Nov. 4, 1998 now U.S. Pat. No. 6,218,233.

BACKGROUND OF THE INVENTION

The present invention relates to a thin film capacitor and a method of forming the same, and more particularly to a thin film capacitor having an improved bottom electrode to be used in a semiconductor integrated circuit.

A high temperature oxygen atmosphere is necessary to form a high dielectric constant thin film such as $SrTiO_3$ or $(Ba, Sr)TiO_3$ which shows several hundreds dielectric constant at room temperature. Such the high dielectric constant thin film is deposited on a bottom electrode of a stable electrically conductive oxide such as $RuO_2$.

In 1994, International Electron Devices Meeting Technical Digest, pp. 831–834, it is disclosed that a polycrystalline $RuO_2$ thin film is deposited by a reactive sputtering method on a TiN thin film serving as a diffusion barrier layer for subsequent patterning the laminations of the TiN thin film and the polycrystalline $RuO_2$ thin film to define an $RuO_2$/TiN storage electrode before an $SrTiO_3$ thin dielectric thin film is deposited on the $RuO_2$/TiN storage electrode by a chemical vapor deposition method.

In 1995, International Electron devices Meeting Technical Digest pp. 119–122, it is disclosed that an Ru thin film is deposited on a TiN diffusion barrier layer before a polycrystalline $RuO_2$ thin film is deposited by a reactive sputtering method on the Ru thin film to form a $RuO_2$/Ru/TiN storage electrode.

FIG. 1 is a fragmentary cross sectional elevation view illustrative of a conventional thin film capacitor having a bottom electrode of an electrically conductive oxide. A TiN diffusion barrier layer 11 is provided on a substrate 9. A polycrystalline conductive oxide bottom electrode 24 is provided on the TiN diffusion barrier layer 11. A dielectric film 25 is provided on the polycrystalline conductive oxide bottom electrode 24. A top electrode 26 is provided on the dielectric film 25.

The polycrystalline conductive oxide bottom electrode 24 has a pillar-shaped or particle-shaped crystal structure with a size of several tens nanometers, for which reason a surface of the polycrystalline conductive oxide bottom electrode 24 also has an roughness of the same size as the crystal structure. Particularly, this problem with the surface roughness of the bottom electrode is significant when the polycrystalline conductive layer serving as the diffusion barrier layer is provided on the substrate and the polycrystalline conductive oxide layer serving as the bottom electrode is provided on the diffusion barrier layer. A field concentration may appear at convex portions of the surface of the bottom electrode. The dielectric film is unlikely to be deposited within concave portions of the surface of the bottom electrode, whereby voids are likely to be formed at the concave portions of the surface of the bottom electrode. For those reasons, a leakage of current may be caused and a breakdown voltage may be reduced.

In Japanese laid-open patent publication No. 2-46756, it is disclosed that a polycrystalline silicon film is subjected to an ion-implantation of As in order to amorphize a surface region of the polycrystalline silicon film before a dielectric film is formed on the amorphized surface region of the polycrystalline silicon film. FIG. 2 is a fragmentary cross sectional elevation view illustrative of a conventional thin film capacitor having a bottom electrode having an amorphized surface region. A silicon oxide film 102 is provided on a silicon substrate 101. A bottom electrode 103 is formed on a selected region of the silicon oxide film 102, wherein the bottom electrode 103 comprises an undoped polycrystalline silicon film and a surface region which comprises an amorphous layer 08. silicon nitride film 104 is provided which extends on the amorphous layer 108 and unselected regions of the silicon oxide film 102. A silicon oxide film 105 is provided on the silicon nitride film 104. A polycrystalline silicon top electrode 106 is provided on the silicon oxide film 105.

FIGS. 3A through 3E are fragmentary cross sectional elevation views illustrative of a conventional method of forming the above conventional thin film capacitor having the bottom electrode having the amorphized surface region.

With reference to FIG. 3A, a silicon oxide film 102 is formed on a silicon substrate 101. An undoped polycrystalline silicon film is deposited by a chemical vapor deposition method on the silicon oxide film 102 for subsequent patterning the undoped polycrystalline silicon film.

With reference to FIG. 3B, the patterned undoped polycrystalline silicon film is then subjected to an ion-implantation of an impurity such as As to amorphize a surface region of the patterned undoped polycrystalline silicon film, thereby forming an amorphous silicon layer 108. As a result, a bottom electrode 103 comprising the undoped polycrystalline silicon film and the amorphous silicon layer 108 is formed on a selected region of the silicon oxide film 102.

With reference to FIG. 3C, a silicon nitride film 104 is formed which extends on the amorphous layer 108 and unselected regions of the silicon oxide film 102.

With reference to FIG. 3D, a silicon oxide film 105 is formed on the silicon nitride film 104.

With reference to FIG. 3E, a polycrystalline silicon top electrode 106 is formed on the silicon oxide film 105.

The dielectric of the capacitor includes the silicon oxide film which has a small dielectric constant. This silicon oxide film reduces an effective capacitance, whereby it is difficult to obtain desired characteristics of the thin film capacitor. Further, the ion-implantation of As for forming the amorphous layer 108 is labored and time-consuming process.

In the above circumstances, it had been required to develop a novel thin film capacitor free from the above problems and a novel method of forming the same.

SUMMARY OF THE INVENTION

Accordingly, it is an object of the present invention to provide a novel thin film capacitor having an improved bottom electrode free from the above problems.

It is a further object of the present invention to provide a novel thin film capacitor having an improved bottom electrode capable of suppressing a leakage of current.

It is a still further object of the present invention to provide a novel thin film capacitor having an improved bottom electrode capable of preventing a drop of the breakdown voltage.

It is yet a further object of the present invention to provide a novel thin film capacitor having an improved bottom electrode having a smooth surface free of a remarkable roughness.

It is a further more object of the present invention to provide an improved bottom electrode for a thin film capacitor, wherein the improved bottom electrode has a smooth surface free of a remarkable roughness for suppressing a leakage of current and preventing a drop of the breakdown voltage.

It is still more object of the present invention to provide a method of forming a novel thin film capacitor having an improved bottom electrode free from the above problems.

It is moreover object of the present invention to provide a method of forming a novel thin film capacitor having an improved bottom electrode capable of suppressing a leakage of current.

It is another object of the present invention to provide a method of forming a novel thin film capacitor having an improved bottom electrode capable of preventing a drop of the breakdown voltage.

It is still another object of the present invention to provide a method of forming a novel thin film capacitor having an improved bottom electrode having a smooth surface free of a remarkable roughness.

It is yet another object of the present invention to provide a method of forming an improved bottom electrode for a thin film capacitor, wherein the improved bottom electrode has a smooth surface free of a remarkable roughness for suppressing a leakage of current and preventing a drop of the breakdown voltage.

The present invention provides a storage electrode of a capacitor. The storage electrode includes a region in contact with a dielectric film of the capacitor, wherein at least the region is made of an amorphous electrically conductive oxide material.

The present invention also provides a method of forming an interface between a bottom electrode and a dielectric film of a capacitor. The method comprises the steps of: forming an amorphous electrically conductive oxide film; and forming a dielectric film on the amorphous electrically conductive oxide film at a temperature lower than a critical temperature of crystallization of the amorphous electrically conductive oxide film so as to form an interface between an amorphous electrically conductive oxide bottom electrode and the dielectric film.

The present invention also provides a method of forming an interface between a bottom electrode and a dielectric film of a capacitor. The method comprises the steps of: forming an amorphous electrically conductive oxide film; forming a first dielectric film on the amorphous electrically conductive oxide film at a temperature lower than a critical temperature of crystallization of the amorphous electrically conductive oxide film so as to form an interface between an amorphous electrically conductive oxide bottom electrode and the dielectric film; and forming a second dielectric film on the first dielectric film at a temperature higher than the critical temperature so as to cause a crystallization of the amorphous electrically conductive oxide film whereby the amorphous electrically conductive oxide film is made into a crystalline electrically conductive oxide bottom electrode thereby to form an interface between the crystalline electrically conductive oxide bottom electrode and the dielectric film.

The present invention also provides a method of forming an interface between a bottom electrode and a dielectric film of a capacitor. The method comprises the steps of: forming an amorphous electrically conductive oxide film; depositing a dielectric film on the amorphous electrically conductive oxide film at a temperature lower than a critical temperature of crystallization of the amorphous electrically conductive oxide film so as to form an interface between an amorphous electrically conductive oxide bottom electrode and the dielectric film; and carrying out a heat treatment to increase a dielectric constant of the dielectric film at a temperature higher than the critical temperature so as to cause a crystallization of the amorphous electrically conductive oxide film whereby the amorphous electrically conductive oxide film is made into a crystalline electrically conductive oxide bottom electrode thereby to form an interface between the crystalline electrically conductive oxide bottom electrode and the dielectric film.

The present invention also provides a method of forming an interface between a bottom electrode and a dielectric film of a capacitor. The method comprises the steps of: growing a crystalline electrically conductive oxide film with an irradiation of an ion onto a growing surface of the crystalline electrically conductive oxide film for etching crystal structures on the growing surface of the crystalline electrically conductive oxide film at a lower etching rate than a growing rate of the crystalline electrically conductive oxide film; and forming a dielectric film on the crystalline electrically conductive oxide film.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
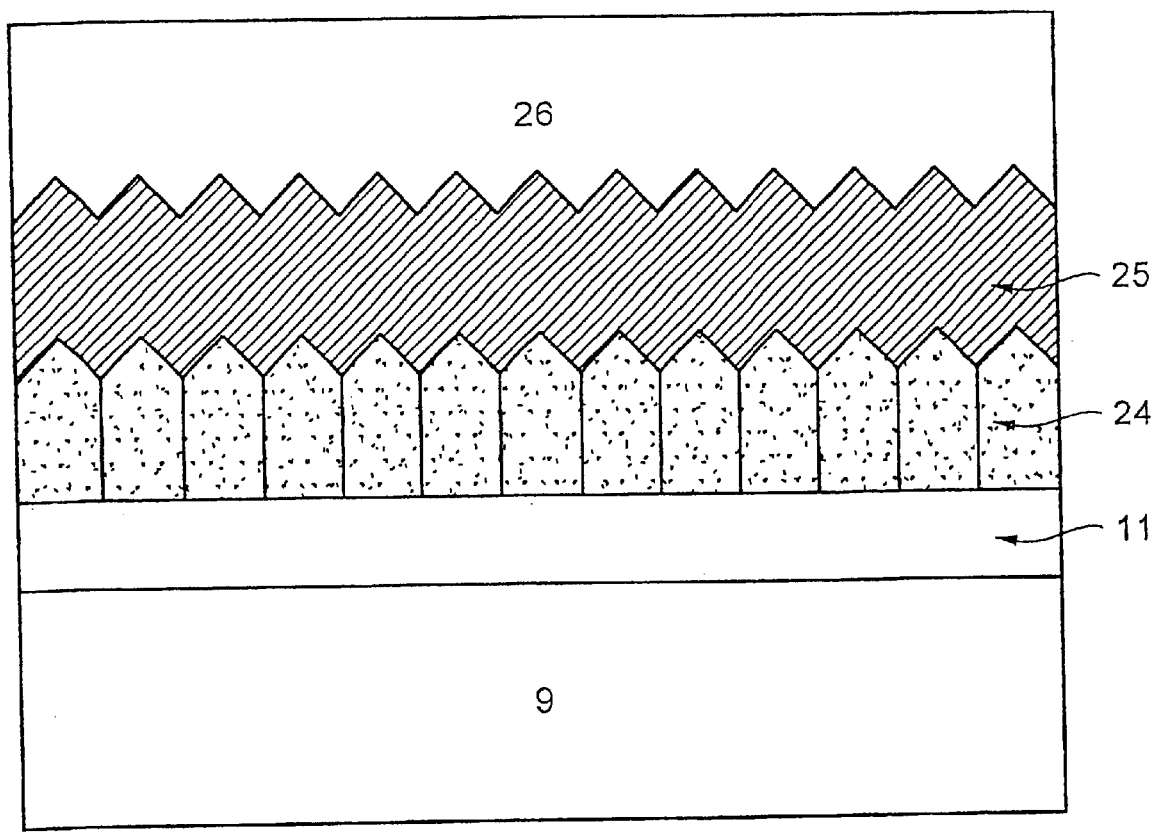
FIG. 1 is a fragmentary cross sectional elevation view illustrative of a conventional thin film capacitor having a bottom electrode of an electrically conductive oxide.
Figure 2:
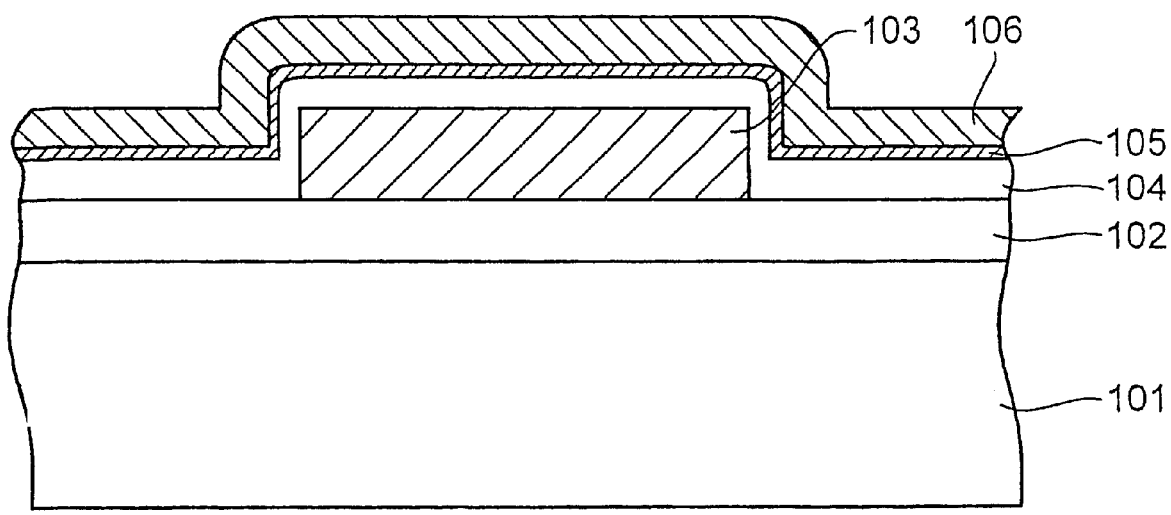
FIG. 2 is a fragmentary cross sectional elevation view illustrative of a conventional thin film capacitor having a bottom electrode having an amorphized surface region.
Figure 3A:
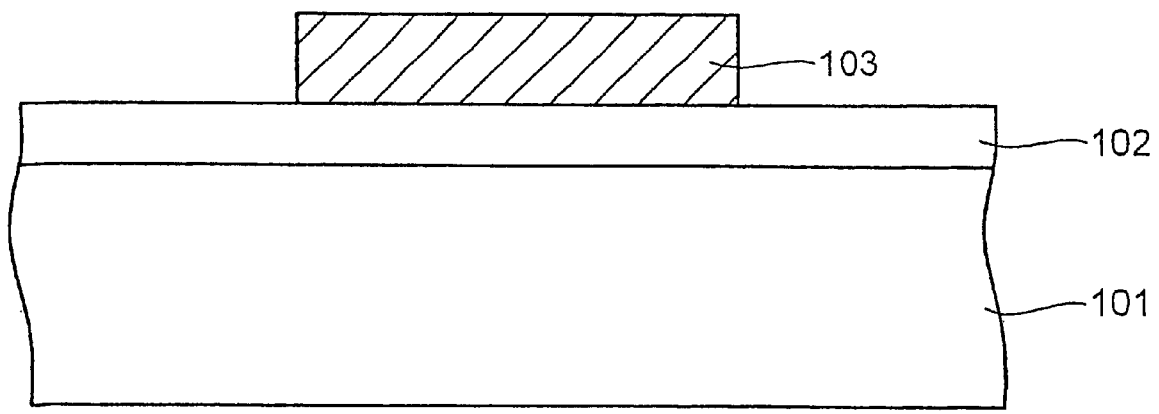
FIGS. 3A through 3E are fragmentary cross sectional elevation views illustrative of a conventional method of forming the above conventional thin film capacitor having the bottom electrode having the amorphized surface region.
Figure 3B:
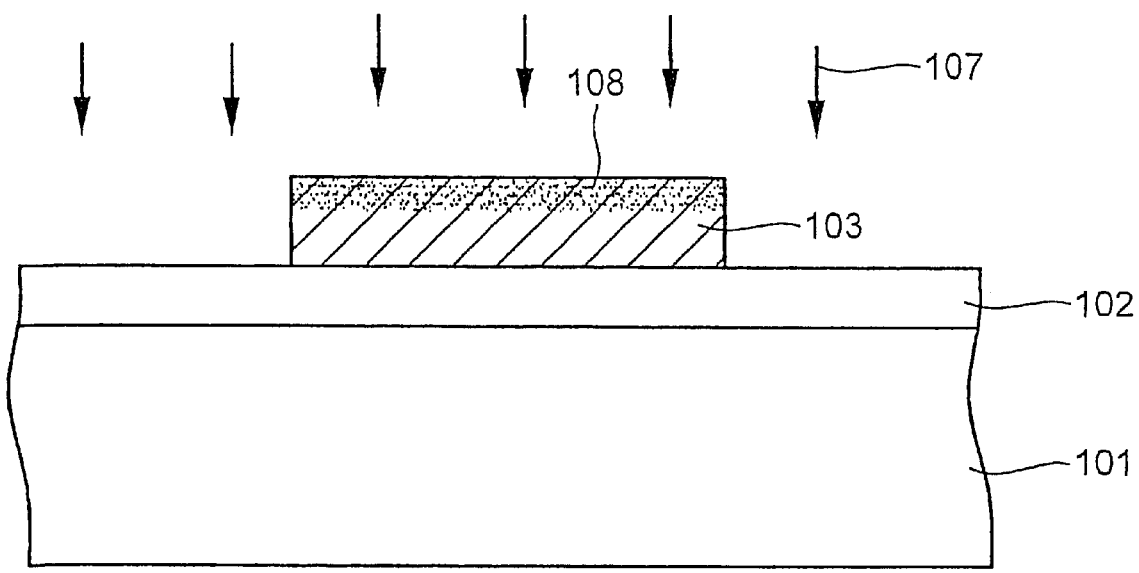
Figure 3C:
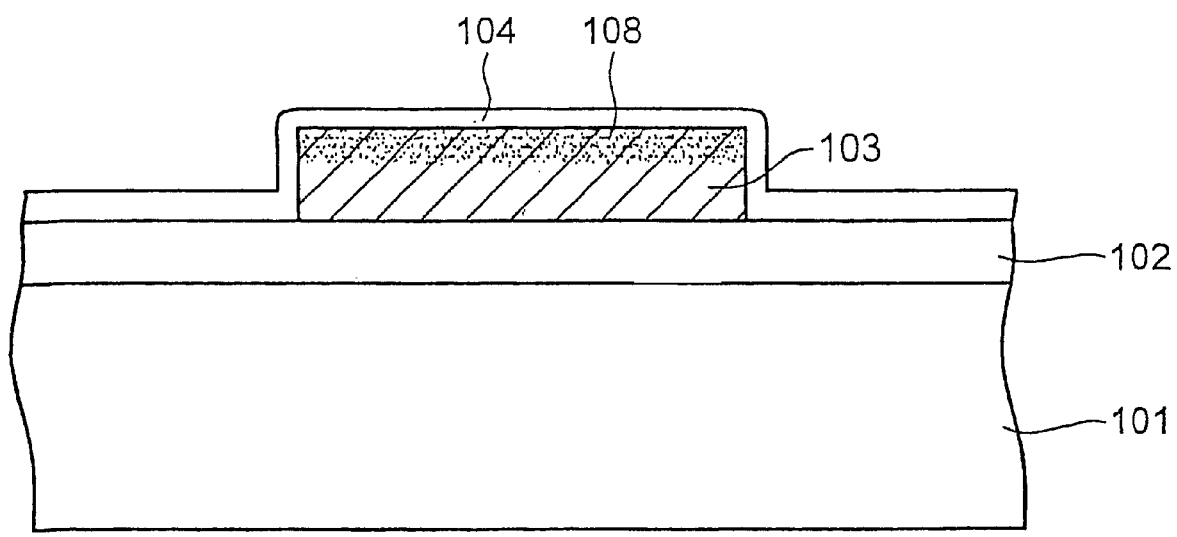
Figure 3D:
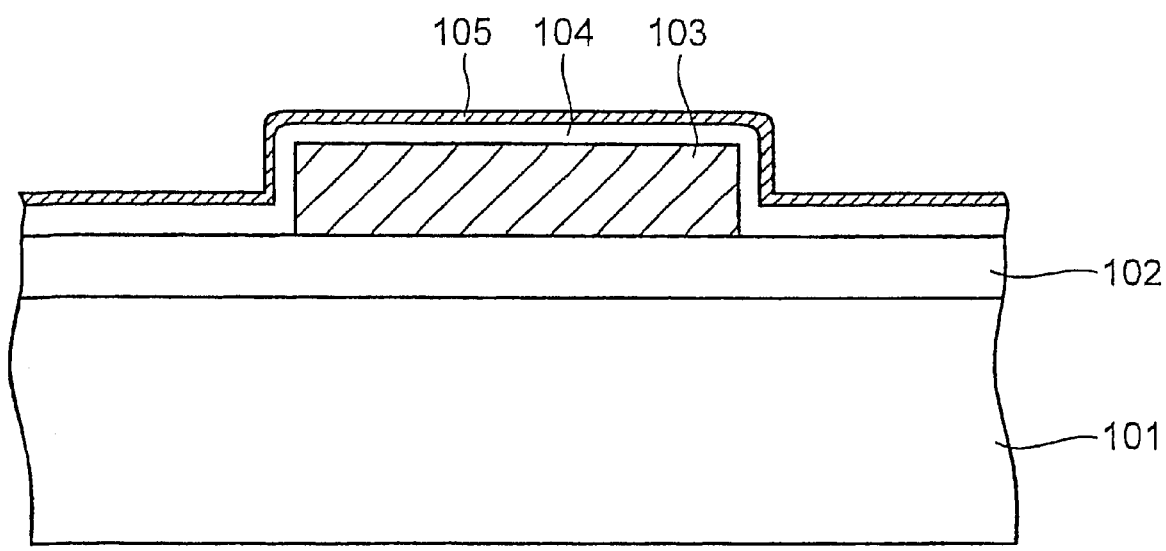
Figure 3E:
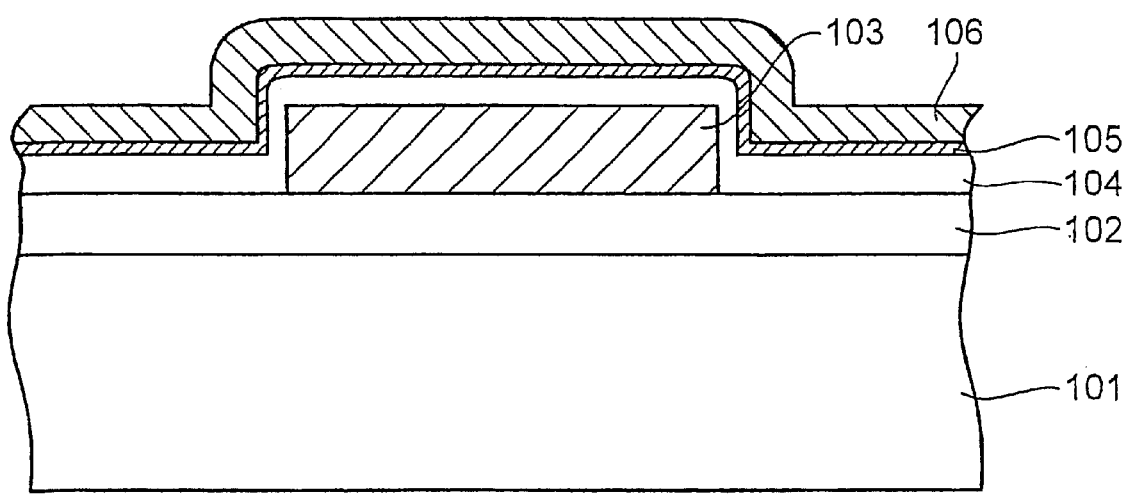

The first present invention provides a storage electrode of a capacitor. The storage electrode includes a region in contact with a dielectric film of the capacitor, wherein at least the region is made of an amorphous electrically conductive oxide material.

It is preferable that an entire part of the storage electrode is made of an amorphous electrically conductive oxide material.

It is also preferable that the amorphous electrically conductive oxide material comprises an oxide of at least a metal selected from the group consisting of Ru, Ir, Os, Re and Rh.

It is also preferable that the amorphous electrically conductive oxide material comprises a material represented by a chemical formula of $ABO_3$, where A is at least an element selected from the group consisting of Ba, Sr, Pb, Ca, La, Li and K; and B is at least an element selected from the group consisting of Zr, Ti, Ta, Nb, Mg, Mn, Fe, Zn and W.

It is also preferable that the amorphous electrically conductive oxide material comprises an oxygen deficiency of a material represented by a chemical formula of $ABO_3$, where A is at least an element selected from the group consisting of Ba, Sr, Pb, Ca, La, Li and K; and B is at least an element selected from the group consisting of Zr, Ti, Ta, Nb, Mg, Mn, Fe, Zn and W.

It is also preferable that the amorphous electrically conductive oxide material comprises a material represented by a chemical formula of $A_2BO_4$, where A is at least an element selected from the group consisting of Ba, Sr, Pb, Ca, La, Li and K; and B is at least an element selected from the group consisting of Zr, Ti, Ta, Nb, Mg, Mn, Fe, Zn and W.

It is also preferable that the amorphous electrically conductive oxide material comprises an oxygen deficiency of a material represented by a chemical formula of $A_2BO_4$, where A is at least an element selected from the group consisting of Ba, Sr, Pb, Ca, La, Li and K; and B is at least an element selected from the group consisting of Zr, Ti, Ta, Nb, Mg, Mn, Fe, Zn and W.

It is also preferable that the amorphous electrically conductive oxide material comprises a material represented by a chemical formula of $A_2B_2O_7$, where A is at least an element selected from the group consisting of Ba, Sr, Pb, Ca, La, Li and K; and B is at least an element selected from the group consisting of Zr, Ti, Ta, Nb, Mg, Mn, Fe, Zn and W.

It is also preferable that the amorphous electrically conductive oxide material comprises an oxygen deficiency of a material represented by a chemical formula of $A_2B_2O_7$, where A is at least an element selected from the group consisting of Ba, Sr, Pb, Ca, La, Li and K; and B is at least an element selected from the group consisting of Zr, Ti, Ta, Nb, Mg, Mn, Fe, Zn and W.

It is also preferable that the amorphous electrically conductive oxide material comprises a material represented by a chemical formula $(Bi_2O_2)A_{m-1}B_mO_{3m+1}$ (m=1, 2, 3, 4, 5), where A is at least an element selected from the group consisting of Ba, Sr, Pb, Ca, K and Bi; and B is at least an element selected from the group consisting of Ti, Ta, Nb and W.

It is also preferable that the amorphous electrically conductive oxide material comprises an oxygen deficiency of a material represented by a chemical formula $(Bi_2O_2)A_{m-1}B_mO_{3m+1}$ (m=1, 2, 3, 4, 5), where A is at least an element selected from the group consisting of Ba, Sr, Pb, Ca, K and Bi; and B is at least an element selected from the group consisting of Ti, Ta, Nb and W.

It is also preferable that the amorphous electrically conductive oxide material is doped with at least a refractory metal.

It is further preferable that the refractory metal is doped in the range of 1–10 at %.

The second present invention provides a storage electrode of a capacitor. The storage electrode includes a region in contact with a dielectric film of the capacitor, wherein at least the region is made of an electrically conductive oxide material of at least a metal selected from the group consisting of Ru, Ir, Os, Re and Rh.

It is preferable that an entire part of the storage electrode is made of an electrically conductive oxide material of at least a metal selected from the group consisting of Ru, Ir, Os, Re and Rh.

It is also preferable that the electrically conductive oxide material is doped with at least a refractory metal.

It is further preferable that the refractory metal is doped in the range of 1–10 at %.

The third present invention provides a storage electrode of a capacitor. The storage electrode including a region in contact with a dielectric film of the capacitor, wherein at least the region is made of an electrically conductive oxide material represented by a chemical formula of $ABO_3$, or an oxygen deficiency thereof, where A is at least an element selected from the group consisting of Ba, Sr, Pb, Ca, La, Li and K; and B is at least an element selected from the group consisting of Zr, Ti, Ta, Nb, Mg, Mn, Fe, Zn and W.

It is preferable that an entire part of the storage electrode is made of an electrically conductive oxide material represented by a chemical formula of $ABO_3$ or an oxygen deficiency thereof, where A is at least an element selected from the group consisting of Ba, Sr, Pb, Ca, La, Li and K; and B is at least an element selected from the group consisting of Zr, Ti, Ta, Nb, Mg, Mn, Fe, Zn and W.

It is also preferable that the electrically conductive oxide material is doped with at least a refractory metal.

It is further preferable that the refractory metal is doped in the range of 1–10 at %.

The fourth present invention provides a storage electrode of a capacitor. The storage electrode includes a region in contact with a dielectric film of the capacitor, wherein at least the region is made of an electrically conductive oxide material represented by a chemical formula of $A_2BO_4$ or an oxygen deficiency thereof, where A is at least an element selected from the group consisting of Ba, Sr, Pb, Ca, La, Li and K; and B is at least an element selected from the group consisting of Zr, Ti, Ta, Nb, Mg, Mn, Fe, Zn and W.

It is preferable that an entire part of the storage electrode is made of an electrically conductive oxide material represented by a chemical formula of $A_2BO_4$ or an oxygen deficiency thereof, where A is at least an element selected from the group consisting of Ba, Sr, Pb, Ca, La, Li and K; and B is at least an element selected from the group consisting of Zr, Ti, Ta, Nb, Mg, Mn, Fe, Zn and W.

It is also preferable that the electrically conductive oxide material is doped with at least a refractory metal.

It is further preferable that the refractory metal is doped in the range of 1–10 at %.

The fifth present invention provides a storage electrode of a capacitor. The storage electrode including a region in contact with a dielectric film of the capacitor, wherein at least the region is made of an electrically conductive oxide material represented by a chemical formula of $A_2B_2O_7$ or an oxygen deficiency thereof, where A is at least an element selected from the group consisting of Ba, Sr, Pb, Ca, La, Li and K; and B is at least an element selected from the group consisting of Zr, Ti, Ta, Nb, Mg, Mn, Fe, Zn and W.

It is preferable that an entire part of the storage electrode is made of an electrically conductive oxide material represented by a chemical formula of $A_2B_2O_7$ or an oxygen deficiency thereof, where A is at least an element selected from the group consisting of Ba, Sr, Pb, Ca, La, Li and K; and B is at least an element selected from the group consisting of Zr, Ti, Ta, Nb, Mg, Mn, Fe, Zn and W.

It is also preferable that the electrically conductive oxide material is doped with at least a refractory metal.

It is further preferable that the refractory metal is doped in the range of 1–10 at %.

The sixth present invention provides a storage electrode of a capacitor. The storage electrode including a region in contact with a dielectric film of the capacitor, wherein at least the region is made of an electrically conductive oxide material represented by a chemical formula of $(Bi_2O_2)A_{m-1}B_mO_{3m+1}$ (m=1, 2, 3, 4, 5) or an oxygen deficiency thereof, where A is at least an element selected from the group consisting of Ba, Sr, Pb, Ca, K and Bi; and B is at least an element selected from the group consisting of Ti, Ta, Nb and W.

It is preferable that an entire part of the storage electrode is made of an electrically conductive oxide material represented by a chemical formula of $(Bi_2O_2)A_{m-1}B_mO_{3m+1}$ (m=1, 2, 3, 4, 5) or an oxygen deficiency thereof, where A is at least an element selected from the group consisting of Ba, Sr, Pb, Ca, K and Bi; and B is at least an element selected from the group consisting of Ti, Ta, Nb and W.

It is also preferable that the electrically conductive oxide material is doped with at least a refractory metal.

It is further preferable that the refractory metal is doped in the range of 1–10 at %.

The seventh present invention provides a method of forming an interface between a bottom electrode and a dielectric film of a capacitor. The method comprises the steps of: forming an amorphous electrically conductive oxide film; and forming a dielectric film on the amorphous electrically conductive oxide film at a temperature lower than a critical temperature of crystallization of the amorphous electrically conductive oxide film so as to form an interface between an amorphous electrically conductive oxide bottom electrode and the dielectric film.

The eighth present invention provides a method of forming an interface between a bottom electrode and a dielectric film of a capacitor. The method comprises the steps of: forming an amorphous electrically conductive oxide film; forming a first dielectric film on the amorphous electrically conductive oxide film at a temperature lower than a critical temperature of crystallization of the amorphous electrically conductive oxide film so as to form an interface between an amorphous electrically conductive oxide bottom electrode and the dielectric film; and forming a second dielectric film on the first dielectric film at a temperature higher than the critical temperature so as to cause a crystallization of the amorphous electrically conductive oxide film whereby the amorphous electrically conductive oxide film is made into a crystalline electrically conductive oxide bottom electrode thereby to form an interface between the crystalline electrically conductive oxide bottom electrode and the dielectric film.

The ninth present invention provides a method of forming an interface between a bottom electrode and a dielectric film of a capacitor. The method comprises the steps of: forming an amorphous electrically conductive oxide film; depositing a dielectric film on the amorphous electrically conductive oxide film at a temperature lower than a critical temperature of crystallization of the amorphous electrically conductive oxide film so as to form an interface between an amorphous electrically conductive oxide bottom electrode and the dielectric film; and carrying out a heat treatment to increase a dielectric constant of the dielectric film at a temperature higher than the critical temperature so as to cause a crystallization of the amorphous electrically conductive oxide film whereby the amorphous electrically conductive oxide film is made into a crystalline electrically conductive oxide bottom electrode thereby to form an interface between the crystalline electrically conductive oxide bottom electrode and the dielectric film.

The tenth present invention provides a method of forming an interface between a bottom electrode and a dielectric film of a capacitor. The method comprises the steps of: growing a crystalline electrically conductive oxide film with an irradiation of an ion onto a growing surface of the crystalline electrically conductive oxide film for etching crystal structures on the growing surface of the crystalline electrically conductive oxide film at a lower etching rate than a growing rate of the crystalline electrically conductive oxide film; and forming a dielectric film on the crystalline electrically conductive oxide film.

PREFERRED EMBODIMENTS

First To Third Embodiments

Figure 4:
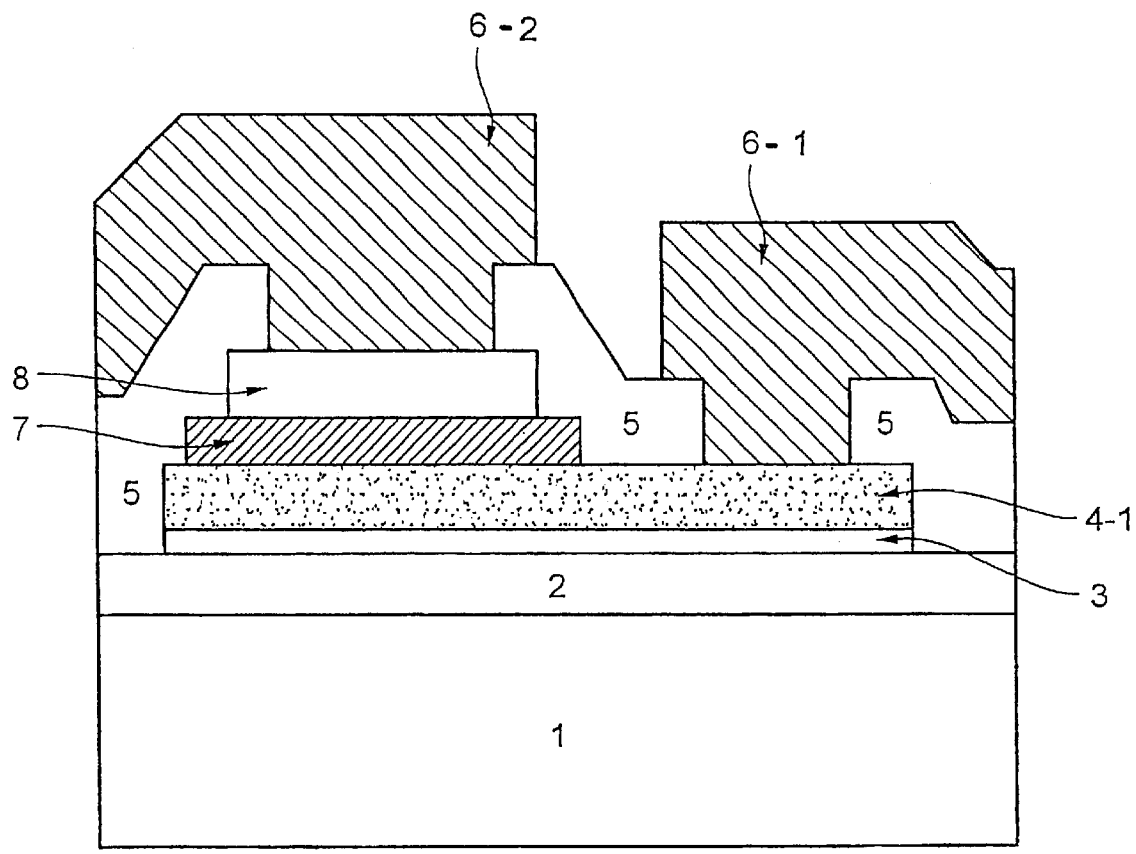
FIG. 4 is a fragmentary cross sectional elevation view illustrative of a first novel thin film capacitor having an improved bottom electrode formed over a semiconductor substrate for a semiconductor integrated circuit in a first embodiment in accordance with the present invention.

A first embodiment according to the present invention will be described in detail with reference to FIG. 4 which is a fragmentary cross sectional elevation view illustrative of a first novel thin film capacitor having an improved bottom electrode formed over a semiconductor substrate for a semiconductor integrated circuit. A $SiO_2$ passivation film 2 is provided on a GaAs substrate 1. A Ti layer 3 having a thickness of 10 nanometers is deposited as a contact layer on a selected region of the $SiO_2$ passivation film 2 by a sputtering method at room temperature. The GaAs substrate 1 is cooled at a temperature of −100° C. indirectly with a liquid nitrogen before an amorphous ruthenium oxide thin film having a thickness of 100 nanometers is deposited on the Ti contact layer 3 by a reactive sputtering method using an Ar–75% $O_2$ mixture gas to form an amorphous ruthenium oxide bottom electrode 4-1 on the Ti contact layer 3. An $SrTiO_3$ thin dielectric film 7 having a thickness of 200 nanometers is deposited on a selected region of the amorphous ruthenium oxide bottom electrode 4-1 by an RF-sputtering method at a temperature of 200° C. A Pt top electrode 8 is provided on the $SrTiO_3$ thin dielectric film 7. A $SiO_2$ interlayer insulator 5 is entirely provided which extends over the Pt top electrode 8, the $SrTiO_3$ thin dielectric film 7, the amorphous ruthenium oxide bottom electrode 4-1 and the $SiO_2$ passivation film 2. The $SiO_2$ interlayer insulator 5 has contact holes positioned over the Pt top electrode 8 and the amorphous ruthenium oxide bottom electrode 4-1. A first Au interconnection layer 6-1 is provided over the $SiO_2$ interlayer insulator 5 and within the contact hole positioned over the amorphous ruthenium oxide bottom electrode 4-1, so that the first Au interconnection layer 6 is in contact with the amorphous ruthenium oxide bottom electrode 4-1. A second Au interconnection layer 6-2 is provided over the $SiO_2$ interlayer insulator 5 and within the contact hole positioned over the Pt top electrode 8, so that the second Au interconnection layer 6 is in contact with the Pt top electrode 8.

Figure 5:
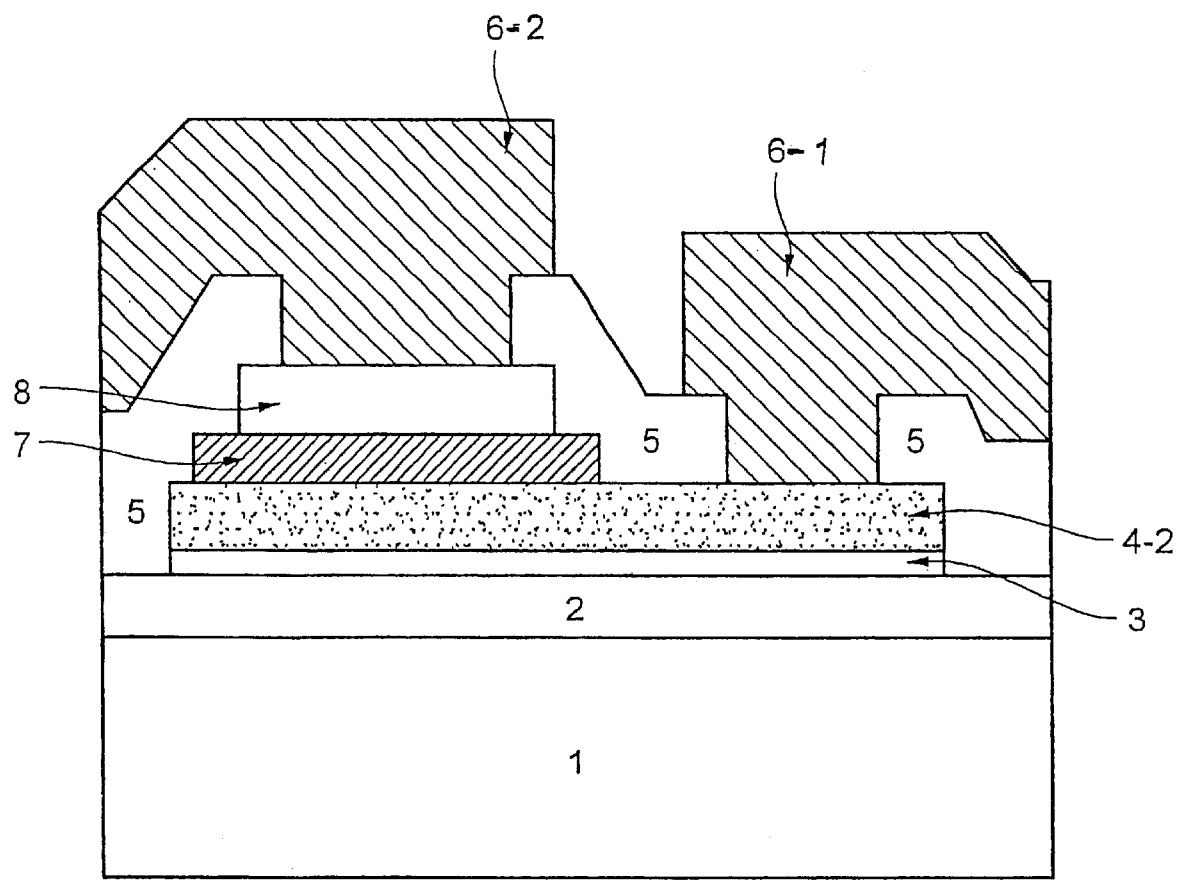
FIG. 5 is a fragmentary cross sectional elevation view illustrative of a first novel thin film capacitor having an improved bottom electrode formed over a semiconductor substrate for a semiconductor integrated circuit in a second embodiment in accordance with the present invention.

A second embodiment according to the present invention will be described in detail with reference to FIG. 5 which is a fragmentary cross sectional elevation view illustrative of a second novel thin film capacitor having an improved bottom electrode formed over a semiconductor substrate for a semiconductor integrated circuit. A $SiO_2$ passivation film 2 is provided on a GaAs substrate 1. A Ti layer 3 having a thickness of 10 nanometers is deposited as a contact layer on a selected region of the $SiO_2$ passivation film 2 by a sputtering method at room temperature. The GaAs substrate 1 is cooled at a temperature of −100° C. indirectly with a liquid nitrogen before an amorphous ruthenium oxide thin film including 1 at % of Mg and having a thickness of 100 nanometers is deposited on the Ti contact layer 3 by a reactive sputtering method to form a 1 at % Mg-containing amorphous ruthenium oxide bottom electrode 4-2 on the Ti contact layer 3. An $SrTiO_3$ thin dielectric film 7 having a thickness of 200 nanometers is deposited on a selected region of the 1 at % Mg-containing amorphous ruthenium oxide bottom electrode 4-2 by an RF-sputtering method at a temperature of 200° C. A Pt top electrode 8 is provided on the $SrTiO_3$ thin dielectric film 7. A $SiO_2$ interlayer insulator 5 is entirely provided which extends over the Pt top electrode 8, the $SrTiO_3$ thin dielectric film 7, the 1 at % Mg-containing amorphous ruthenium oxide bottom electrode 4-2 and the $SiO_2$ passivation film 2. The $SiO_2$ interlayer insulator 5 has contact holes positioned over the Pt top electrode 8 and the 1 at % Mg-containing amorphous ruthenium oxide bottom electrode 4-2. A first Au interconnection layer 6-1 is provided over the $SiO_2$ interlayer insulator 5 and within the contact hole positioned over the 1 at % Mg-containing amorphous ruthenium oxide bottom electrode 4-2, so that the first Au interconnection layer 6 is in contact with the 1 at % Mg-containing amorphous ruthenium oxide bottom electrode 4-2. A second Au interconnection layer 6-2 is provided over the $SiO_2$ interlayer insulator 5 and within the contact hole positioned over the Pt top electrode 8, so that the second Au interconnection layer 6 is in contact with the Pt top electrode 8.

Figure 6:
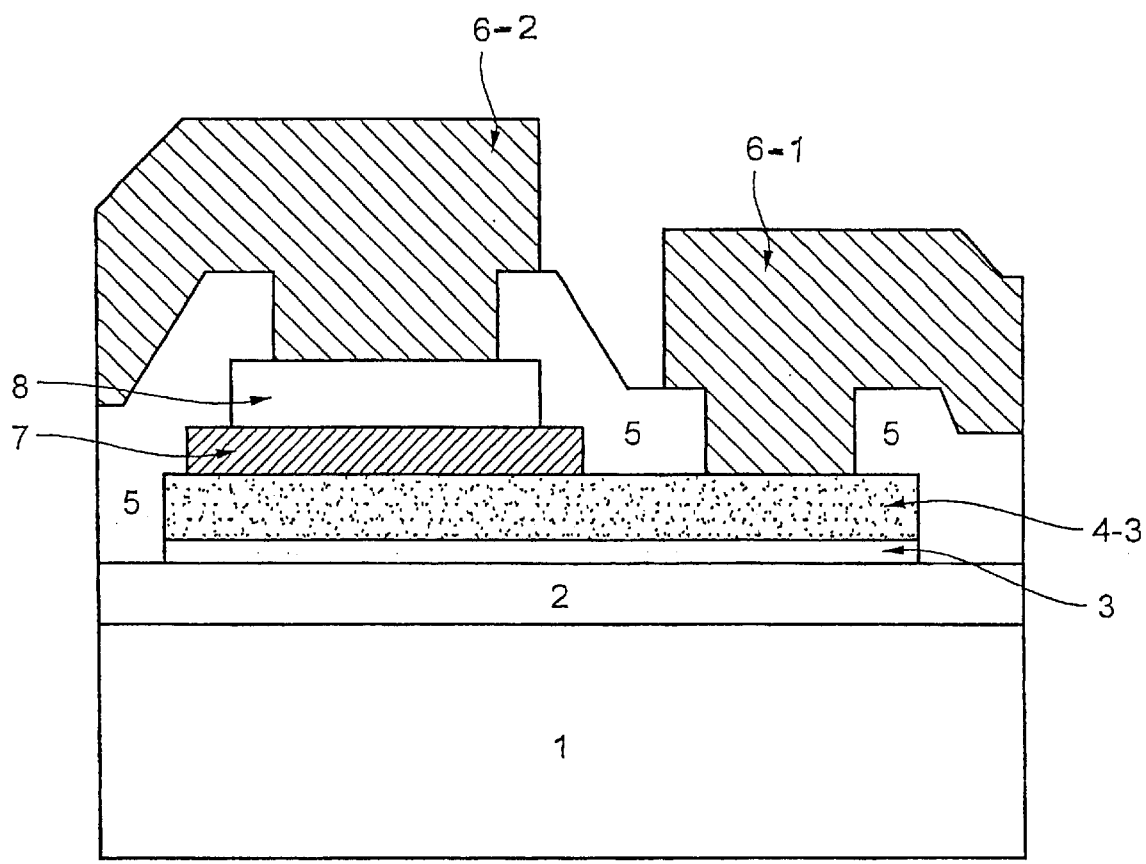
FIG. 6 is a fragmentary cross sectional elevation view illustrative of a first novel thin film capacitor having an improved bottom electrode formed over a semiconductor substrate for a semiconductor integrated circuit in a third embodiment in accordance with the present invention.

A third embodiment according to the present invention will be described in detail with reference to FIG. 6 which is a fragmentary cross sectional elevation view illustrative of a third novel thin film capacitor having an improved bottom electrode formed over a semiconductor substrate for a semiconductor integrated circuit. A $SiO_2$ passivation film 2 is provided on a GaAs substrate 1. A Ti layer 3 having a thickness of 10 nanometers is deposited as a contact layer on a selected region of the $SiO_2$ passivation film 2 by a sputtering method at room temperature. The GaAs substrate 1 is cooled at a temperature of −100° C. indirectly with a liquid nitrogen before an (Ru, Ir)$O_2$ amorphous oxide thin film having a thickness of 100 nanometers is deposited on the Ti contact layer 3 by a reactive sputtering method to form an (Ru, Ir)$O_2$ amorphous oxide bottom electrode 4-3 on the Ti contact layer 3, wherein the (Ru, Ir)$O_2$ amorphous oxide is an amorphous solid solution of either a ruthenium dioxide $RuO_2$ or an iridium dioxide $IrO_2$. An $SrTiO_3$ thin dielectric film 7 having a thickness of 200 nanometers is deposited on a selected region of the (Ru, Ir)$O_2$ amorphous oxide bottom electrode 4-3 by an RF-sputtering method at a temperature of 200° C. A Pt top electrode 8 is provided on the $SrTiO_3$ thin dielectric film 7. A $SiO_2$ interlayer insulator 5 is entirely provided which extends over the Pt top electrode 8, the $SrTiO_3$ thin dielectric film 7, the (Ru, Ir)$O_2$ amorphous oxide bottom electrode 4-3 and the $SiO_2$ passivation film 2. The $SiO_2$ interlayer insulator 5 has contact holes positioned over the Pt top electrode 8 and the (Ru, Ir)$O_2$ amorphous oxide bottom electrode 4-3. A first Au interconnection layer 6-1 is provided over the $SiO_2$ interlayer insulator 5 and within the contact hole positioned over the (Ru, Ir)$O_2$ amorphous oxide bottom electrode 4-3, so that the first Au interconnection layer 6 is in contact with the (Ru, Ir)$O_2$ amorphous oxide bottom electrode 4-3. A second Au interconnection layer 6-2 is provided over the $SiO_2$ interlayer insulator 5 and within the contact hole positioned over the Pt top electrode 8, so that the second Au interconnection layer 6 is in contact with the Pt top electrode 8.

Figure 7:
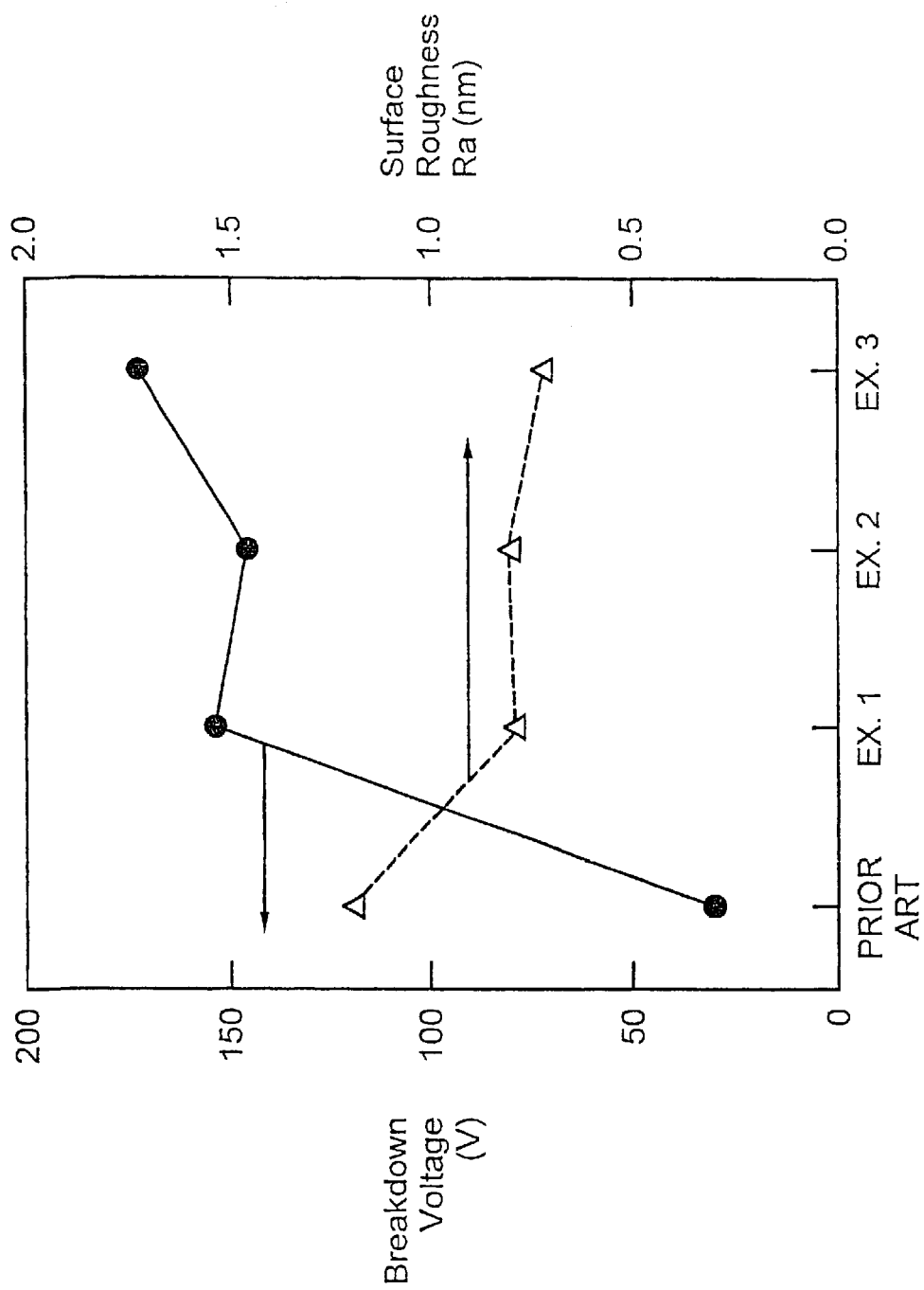
FIG. 7 is a diagram illustrative of breakdown voltages and surface roughness for each of the conventional thin capacitor, the first novel thin film capacitor having the amorphous ruthenium oxide bottom electrode in the first embodiment, the second novel thin film capacitor having the 1 at % Mg-containing amorphous ruthenium oxide bottom electrode in the second embodiment, and the third novel thin film capacitor having the $(Ru, Ir)O_2$ amorphous oxide bottom electrode in the third embodiment in accordance with the present invention.

FIG. 7 is a diagram illustrative of breakdown voltages and surface roughness for each of the conventional thin film capacitor, the first novel thin film capacitor having the amorphous ruthenium oxide bottom electrode in the first embodiment, the second novel thin film capacitor having the 1 at % Mg-containing amorphous ruthenium oxide bottom electrode in the second embodiment, and the third novel thin film capacitor having the (Ru, Ir)$O_2$ amorphous oxide bottom electrode in the third embodiment, wherein ● represents the breakdown voltage, whilst Δ represents the surface roughness. The conventional thin film capacitor surface roughness of about 1.3 nanometers and a breakdown voltage of about 35V.

The first novel thin film capacitor having the amorphous ruthenium oxide bottom electrode in the first embodiment has a surface roughness of about 0.8 nanometers and a breakdown voltage of about 155V. The amorphous film has a relatively smooth surface with a reduced roughness. Further, the dielectric layer of the capacitor is formed at a temperature of not higher than a critical temperature for crystallization of the amorphous so that the amorphous film remains in amorphous state during the formation of the dielectric layer, for which reason the first novel thin film capacitor has a reduced surface roughness and an improved breakdown voltage. The reduction in surface roughness of the bottom electrode causes an improvement in the breakdown voltage thereof.

The second novel thin film capacitor having the 1 at % Mg-containing amorphous ruthenium oxide bottom electrode in the second embodiment has a surface roughness of about 0.8 nanometers and a breakdown voltage of about 150V. The amorphous film has a relatively smooth surface with a reduced roughness. Further, the dielectric layer of the capacitor is formed at a temperature of not higher than a critical temperature for crystallization of the amorphous so that the amorphous film remains in amorphous state during the formation of the dielectric layer, for which reason the second novel thin film capacitor has a reduced surface roughness and an improved breakdown voltage. The reduction in surface roughness of the bottom electrode causes an improvement in the breakdown voltage thereof.

The third novel thin film capacitor having the $(Ru, Ir)O_2$ amorphous oxide bottom electrode in the third embodiment has a surface roughness of about 0.75 nanometers and a breakdown voltage of about 175V The amorphous film has a relatively smooth surface with a reduced roughness. Further, the dielectric layer of the capacitor is formed at a temperature of not higher than a critical temperature for crystallization of the amorphous so that the amorphous film remains in amorphous state during the formation of the dielectric layer, for which reason the third novel thin film capacitor has a reduced surface roughness and an improved breakdown voltage. The reduction in surface roughness of the bottom electrode causes an improvement in the breakdown voltage thereof.

As described in the second embodiment, it is preferable to add an element to the amorphous oxide bottom electrode for controlling electric characteristics of the thin film capacitor and also for stabilizing the amorphous state of the amorphous oxide bottom electrode. Refractory metals such as Mg or Ti are suitable for addition into the amorphous oxide bottom electrode. It was confirmed that even if an amount of the element added into the amorphous oxide bottom electrode is beyond 10 at %, then substantially no further effect can be obtained, for which reason a preferable range of amount of the element added into the amorphous oxide bottom electrode is 1–10 at %.

If the bottom electrode is made of other materials having similar structures and characteristics to the iridium oxide and ruthenium oxide, then the same effect as described in the third embodiment can be obtained. For example, osmium oxide, rhenium oxide, rhodium oxide and solid solutions thereof are also available to obtain substantially the same effects as in the third embodiment.

In the above first to third embodiments, the substrate is cooled by the liquid nitrogen down to −100° C. for subsequent deposition of the amorphous oxide layer by a sputtering method. Notwithstanding, it is also available to cool the substrate down to a temperature of not higher than 100° C. to form the required amorphous oxide film by not only the sputtering method but also other deposition methods such as chemical vapor deposition.

Fourth Embodiment

Figure 8:
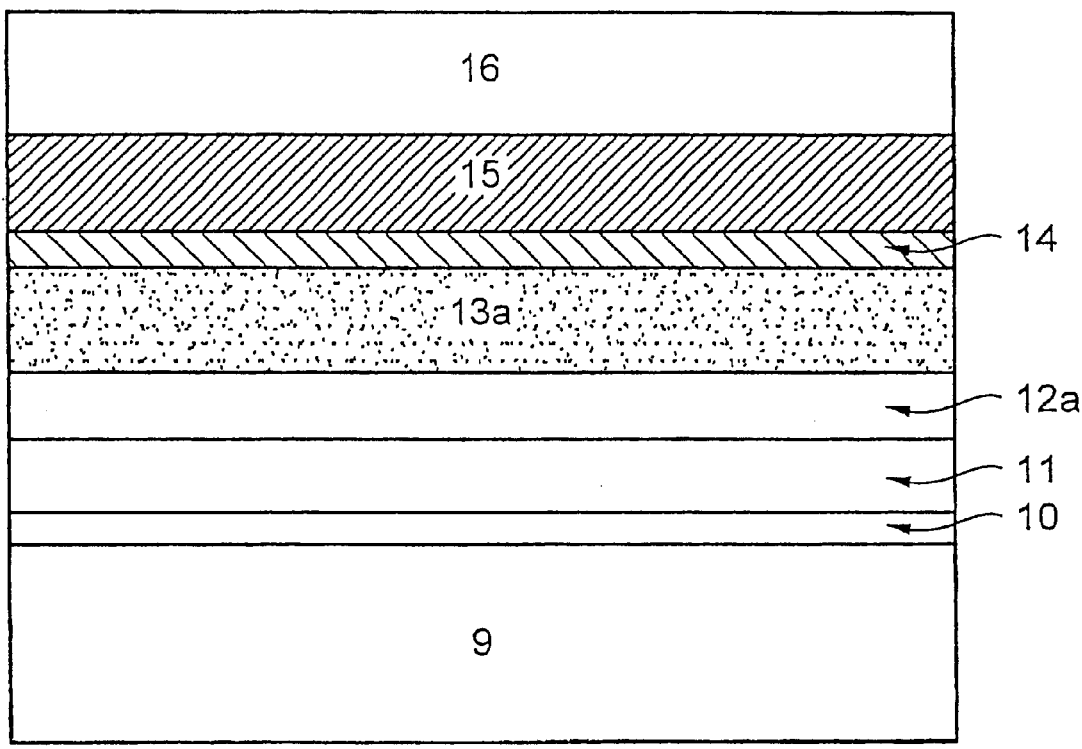
FIG. 8 is a fragmentary cross sectional elevation view illustrative of a novel thin film capacitor having an improved bottom electrode formed over a semiconductor substrate for a semiconductor integrated circuit in the fourth embodiment in accordance with the present invention.

A fourth embodiment according to the present invention will be described in detail with reference to FIG. 8 which is a fragmentary cross sectional elevation view illustrative of a fourth novel thin film capacitor having an improved bottom electrode formed over a semiconductor substrate for a semiconductor integrated circuit. A $TiSi_2$ first diffusion barrier layer 10 is provided on a Si substrate 9. A TiN second diffusion barrier layer 11 is provided on the $TiSi_2$ first diffusion barrier layer 10. An Ir third diffusion barrier layer 12a is provided on the TiN second diffusion barrier layer 11. The Si substrate 9 is cooled at a temperature of −100° C. indirectly with a liquid nitrogen before an amorphous ruthenium oxide thin film is deposited on the Ir third diffusion barrier layer 12a by a reactive sputtering method using an Ar–75% $O_2$ mixture gas to form an amorphous ruthenium oxide bottom electrode 13a on the Ir third diffusion barrier layer 12a. A $(Ba_{0.5}Sr_{0.5})TiO_3$ first thin dielectric film 14 having a thickness of 10 nanometers is deposited on the amorphous ruthenium oxide bottom electrode 13a by an RF-sputtering method at a temperature of 300° C., whereby a smooth interface with a small roughness is formed between the amorphous ruthenium oxide bottom electrode 13a and the $(Ba_{0.5}Sr_{O.5})$TiO3 first thin dielectric film 14. A $(Ba_{0.5}Sr_{0.5})TiO_3$ second thin dielectric film 15 having a thickness of 200 nanometers is deposited on the $(Ba_{0.5}Sr_{0.5})TiO_3$ first thin dielectric film 14 by an RF-sputtering method at a higher temperature of 450° C., whereby the above amorphous ruthenium oxide bottom electrode 13a is crystallized to form a single crystal ruthenium oxide bottom electrode 13a. Since, however, the smooth interface has already been defined between the amorphous ruthenium oxide bottom electrode 13a and the $(Ba_{0.5}Sr_{0.5})TiO_3$ first thin dielectric film 14, the interface between the single crystal ruthenium oxide bottom electrode 13a and the $(Ba_{0.5}Sr_{0.5})TiO_3$ first thin dielectric film 14 remains smooth. Namely, the high flatness of the surface of the single crystal ruthenium oxide bottom electrode 13a can be obtained. Since, further, the $(Ba_{0.5}Sr_{0.5})TiO_3$ second thin dielectric film 15 is formed by the higher temperature than when the $(Ba_{0.5}Sr_{0.5})TiO_3$ first thin dielectric film 14 is formed, then the $(Ba_{0.5}Sr_{0.5})TiO_3$ second thin dielectric film 15 has a higher dielectric constant than the $(Ba_{0.5}Sr_{0.5})TiO_3$ first thin dielectric film 14. Since, furthermore, the $(Ba_{0.5}Sr_{0.5})TiO_3$ second thin dielectric film 15 is much thicker than the $(Ba_{0.5}Sr_{0.5})TiO_3$ first thin dielectric film 14, a dielectric constant of the capacitor largely depends upon the higher dielectric constant of the $(Ba_{0.5}Sr_{0.5})TiO_3$ second thin dielectric film 15. Thus, the above structure makes it possible to obtain both the required smooth interface between the bottom electrode and the dielectric film of the capacitor and the required high dielectric constant of the capacitor. An Ru top electrode 16 is provided on the $(Ba_{0.5}Sr_{0.5})TiO_3$ second thin dielectric film 15.

Figure 9:
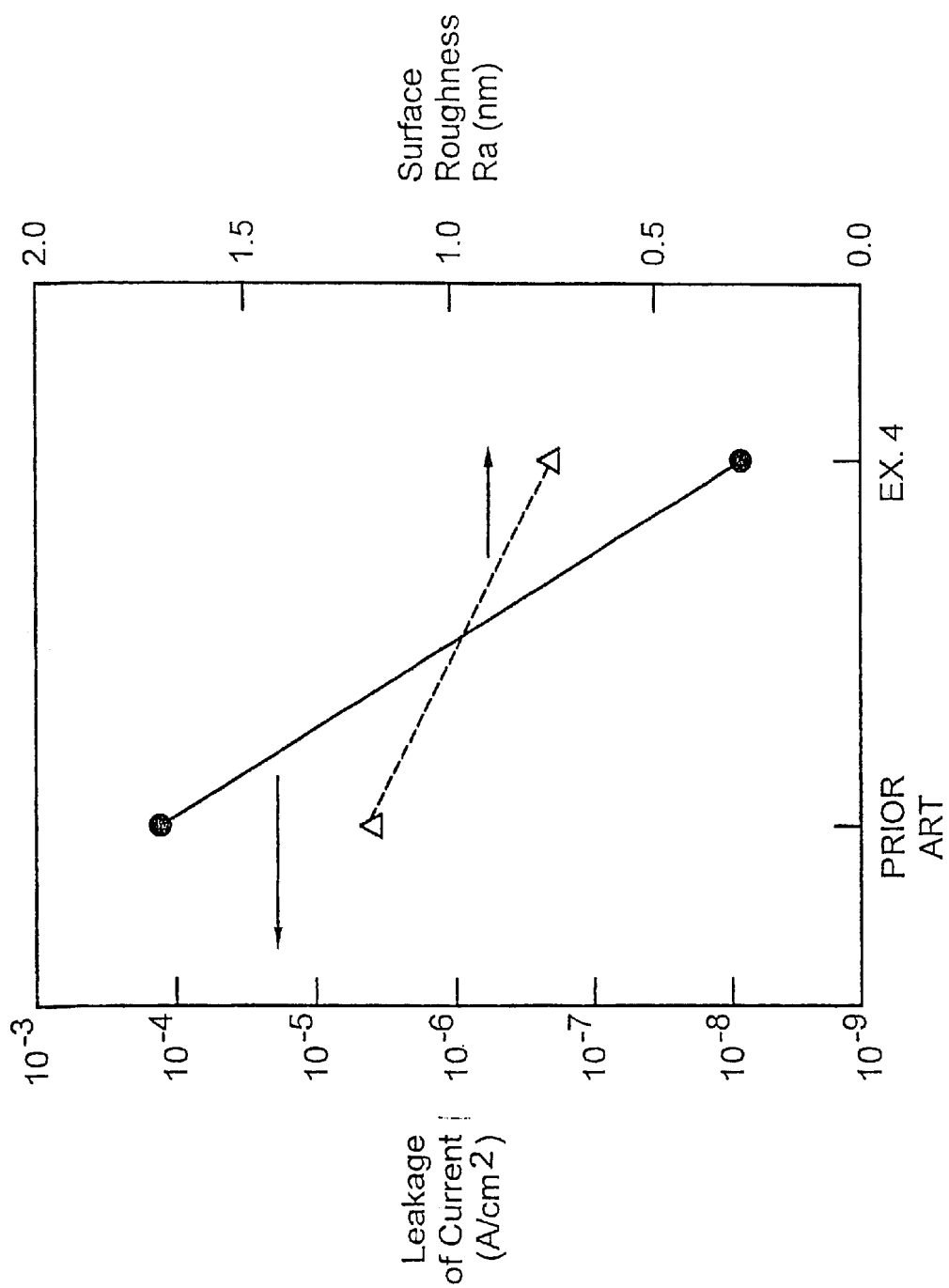
FIG. 9 is a diagram illustrative of leakage of currents and surface roughness for each of the conventional thin film capacitor and the fourth novel thin film capacitor in the fourth embodiment in accordance with the present invention.

FIG. 9 is a diagram illustrative of leakage of currents and surface roughness for each of the conventional thin film capacitor and the fourth novel thin film capacitor, wherein ● represents the leakage of currents, whilst Δ represents the surface roughness. The conventional thin film capacitor has a surface roughness of about 1.2 nanometers and a leakage of current of about $1.3×10^{-4}$ $A/cm^2$.

The fourth novel thin film capacitor in the fourth embodiment has a surface roughness of about 0.8 nanometers and a leakage of current of about $1.0×10^{-8}$ $A/cm^2$. The bottom electrode has a relatively smooth surface with a reduced roughness, whereby the leakage of current is reduced. As described above, when the $(Ba_{0.5}Sr_{0.5})TiO_3$ second thin dielectric film 15 is deposited at the higher temperature of 450° C., the above amorphous ruthenium oxide bottom electrode 13a is crystallized to form the single crystal ruthenium oxide bottom electrode 13a. However, the smooth interface has already been defined between the amorphous ruthenium oxide bottom electrode 13a and the $(Ba_{0.5}Sr_{0.5})TiO_3$ first thin dielectric film 14, for which reason the interface between the single crystal ruthenium oxide bottom electrode 13a and the $(Ba_{0.5}Sr_{0.5})TiO_3$ first thin dielectric film 14 remains smooth. Namely, the high flatness of the surface of the single crystal ruthenium oxide bottom electrode 13a can be obtained.

Further, as also described above, the $(Ba_{0.5}Sr_{0.5})TiO_3$ second thin dielectric film 15 is formed by the higher temperature than when the $(Ba_{0.5}Sr_{0.5})TiO_3$ first thin dielectric film 14 is formed, then the $(Ba_{0.5}Sr_{0.5})TiO_3$ second thin dielectric film 15 has a higher dielectric constant than the $(Ba_{0.5}Sr_{0.5})TiO_3$ first thin dielectric film 14. Furthermore, the $(Ba_{0.5}Sr_{0.5})TiO_3$ second thin dielectric film 15 is much thicker than the $(Ba_{0.5}Sr_{0.5})TiO_3$ first thin dielectric film 14, for which reason the dielectric constant of the capacitor largely depends upon the higher dielectric constant of the $(Ba_{0.5}Sr_{0.5})TiO_3$ second thin dielectric film 15. Thus, the above structure makes it possible to obtain both the required smooth interface between the bottom electrode and the dielectric film of the capacitor and the required high dielectric constant of the capacitor.

Fifth To Seventh Embodiments

Figure 10:
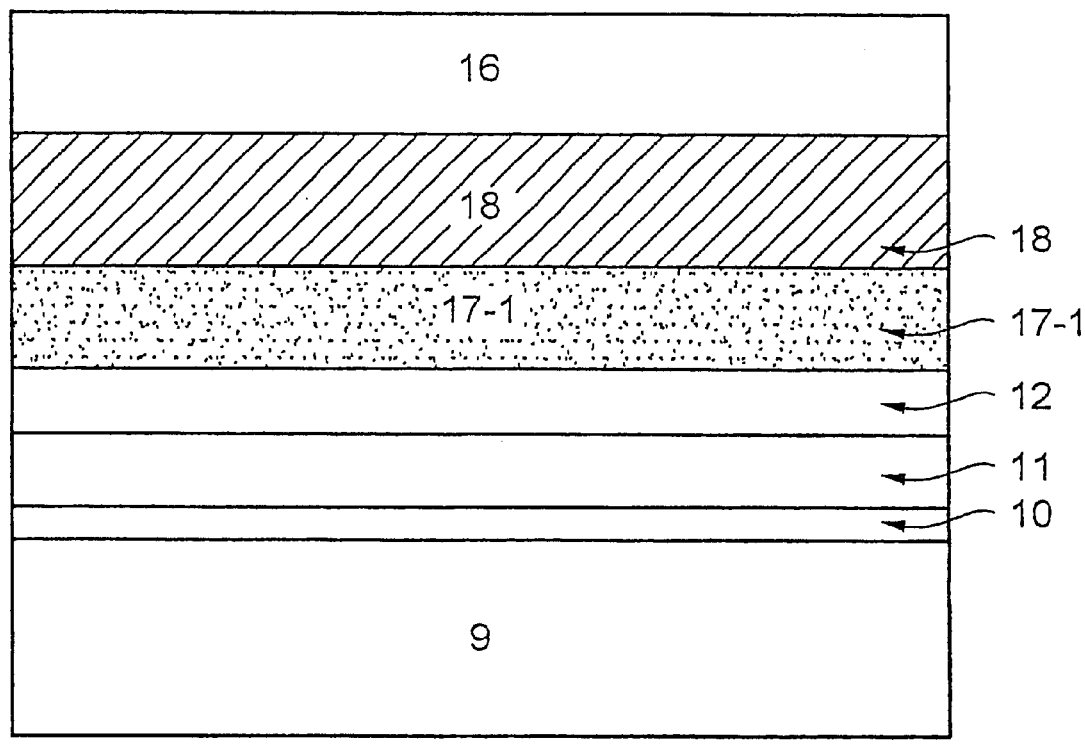
FIG. 10 is a fragmentary cross sectional elevation view illustrative of a first novel thin film capacitor having an improved bottom electrode formed over a semiconductor substrate for a semiconductor integrated circuit in a fifth embodiment in accordance with the present invention.

A fifth embodiment according to the present invention will be described in detail with reference to FIG. 10 which is a fragmentary cross sectional elevation view illustrative of a fifth novel thin film capacitor having an improved bottom electrode formed over a semiconductor substrate for a semiconductor integrated circuit. A $TiSi_2$ first diffusion barrier layer 10 is provided on a Si substrate 9. A TiN second diffusion barrier layer 11 is provided on the $TiSi_2$ first diffusion barrier layer 10. An Ru third diffusion barrier layer 12a is provided on the TiN second diffusion barrier layer 11. The Si substrate 9 is cooled at a temperature of −100° C. indirectly with a liquid nitrogen before an amorphous ruthenium oxide thin film is deposited on the Ru third diffusion barrier layer 12 by a reactive sputtering method using an Ar–75% $O_2$ mixture gas to form an amorphous strontium ruthenium oxide $SrRuO_3$ layer on the Ru third diffusion barrier layer 12. A $Pb(Zr_{0.48}Ti_{0.52})O_3$ thin film having a thickness of 200 nanometers is deposited on the amorphous strontium ruthenium oxide $SrRuO_3$ layer by an RF-sputtering method at a temperature of 300° C., before the whereby a smooth interface with a small roughness is formed between the $Pb(Zr_{0.48}Ti_{0.52})O_3$ thin film is subjected to a rapid thermal annealing in an oxygen atmosphere at a temperature of 600° C. for 30 seconds to cause a crystallization of the amorphous strontium ruthenium oxide $SrRuO_3$ layer thereby to form a strontium ruthenium oxide $SrRuO_3$ bottom electrode 17-1 and also to form a $Pb(Zr_{0.48}Ti_{0.52})O_3$ thin dielectric film 18 on the strontium ruthenium oxide $SrRuO_3$ bottom electrode 17-1. An Ru top electrode 16 is provided on the $Pb(Zr_{0.48}Ti_{0.52})O_3$ thin dielectric film 18. During the deposition process of the $Pb(Zr_{0.48}Ti_{0.52})O_3$ thin film at the temperature of 300° C., no crystallization is caused to the amorphous strontium ruthenium oxide $SrRuO_3$ layer, for which reason the smooth surface of the amorphous strontium ruthenium oxide $SrRuO_3$ layer remains unchanged, whereby the smooth interface can be obtained between the amorphous strontium ruthenium oxide $SrRuO_3$ bottom electrode 17-1 and the amorphous $Pb(Zr_{0.48}Ti_{0.52})O_3$ thin film. During the subsequent rapid thermal annealing at the temperature of 600° C. for forming the $Pb(Zr_{0.48}Ti_{0.52})O_3$ thin dielectric film 18, the amorphous strontium ruthenium oxide $SrRuO_3$ layer is crystallized to form the strontium ruthenium oxide $SrRuO_3$ bottom electrode 17-1. Notwithstanding, the smooth interface between the amorphous strontium ruthenium oxide $SrRuO_3$ layer and the $Pb(Zr_{0.48}Ti_{0.52})O_3$ thin film has already been defined, for which reason the smooth interface can be obtained between the strontium ruthenium oxide $SrRuO_3$ bottom electrode 17-1 and the $Pb(Zr_{0.48}Ti_{0.52})O_3$ thin dielectric film 18. Further, the $Pb(Zr_{0.48}Ti_{0.52})O_3$ thin dielectric film 18 is formed by the high temperature annealing, for which reason the $Pb(Zr_{0.48}Ti_{0.52})O_3$ thin dielectric film 18 has a high dielectric constant. Thus, the above structure makes it possible to obtain both the required smooth interface between the bottom electrode and the dielectric film of the capacitor and the required high dielectric constant of the capacitor.

Figure 11:
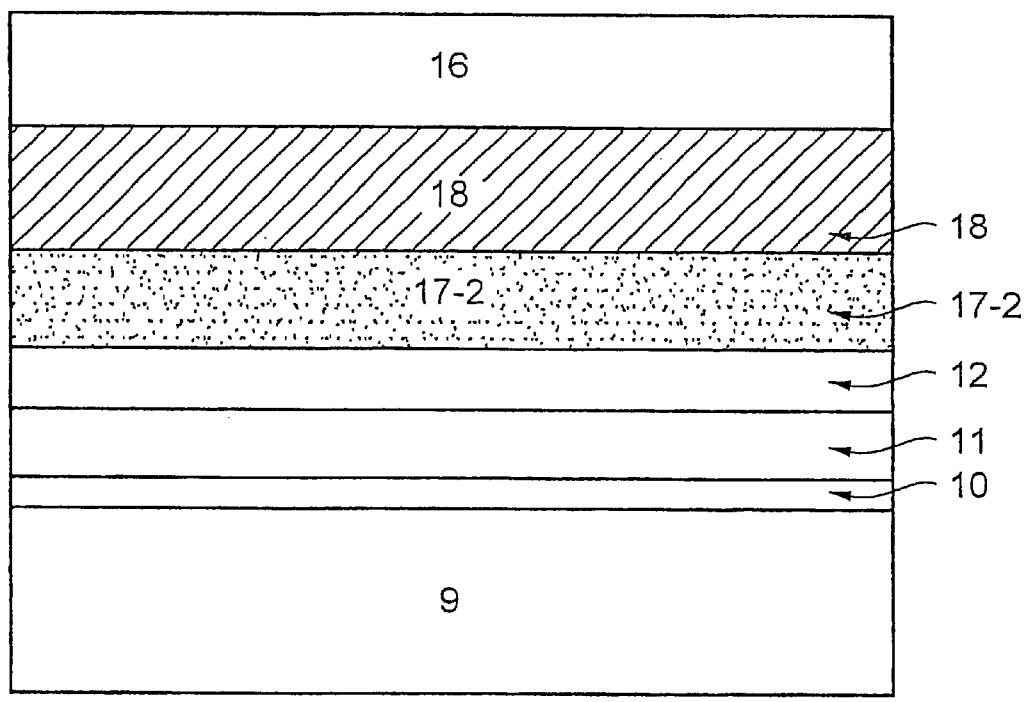
FIG. 11 is a fragmentary cross sectional elevation view illustrative of a first novel thin film capacitor having an improved bottom electrode formed over a semiconductor substrate for a semiconductor integrated circuit in a sixth embodiment in accordance with the present invention.

A sixth embodiment according to the present invention will be described in detail with reference to FIG. 11 which is a fragmentary cross sectional elevation view illustrative of a sixth novel thin film capacitor having an improved bottom electrode formed over a semiconductor substrate for a semiconductor integrated circuit. A $TiSi_2$ first diffusion barrier layer 10 is provided on a Si substrate 9. A TiN second diffusion barrier layer 11 is provided on the $TiSi_2$ first diffusion barrier layer 10. An Ru third diffusion barrier layer 12a is provided on the TiN second diffusion barrier layer 11. The Si substrate 9 is cooled at a temperature of −100° C. indirectly with a liquid nitrogen before an amorphous ruthenium oxide thin film is deposited on the Ru third diffusion barrier layer 12 by a reactive sputtering method using an Ar–75% $O_2$ mixture gas to form an amorphous strontium ruthenium oxide $SrRuO_3$ layer including 5 at % of Mg on the Ru third diffusion barrier layer 12. A $Pb(Zr_{0.48}Ti_{0.52})O_3$ thin film having a thickness of 200 nanometers is deposited on the 5 at % Mg-containing amorphous strontium ruthenium oxide $SrRuO_3$ layer by an RF-sputtering method at a temperature of 300° C., before the whereby a smooth interface with a small roughness is formed between the $Pb(Zr_{0.48}Ti_{0.52})O_3$ thin film is subjected to a rapid thermal annealing in an oxygen atmosphere at a temperature of 600° C. for 30 seconds to cause a crystallization of the 5 at % Mg-containing amorphous strontium ruthenium oxide $SrRuO_3$ layer thereby to form a 5 at % Mg-containing strontium ruthenium oxide $SrRuO_3$ bottom electrode 17-2 and also to form a $Pb(Zr_{0.48}Ti_{0.52})O_3$ thin dielectric film 18 on the 5 at % Mg-containing strontium ruthenium oxide $SrRuO_3$ bottom electrode 17-2. An Ru top electrode 16 is provided on the $Pb(Zr_{0.48}Ti_{0.52})O_3$ thin dielectric film 18. During the deposition process of the $Pb(Zr_{0.48}Ti_{0.52})O_3$ thin film at the temperature of 300° C., no crystallization is caused to the 5 at % Mg-containing amorphous strontium ruthenium oxide $SrRuO_3$ layer, for which reason the smooth surface of the 5 at % Mg-containing amorphous strontium ruthenium oxide $SrRuO_3$ layer remains unchanged, whereby the smooth interface can be obtained between the 5 at % Mg-containing amorphous strontium ruthenium oxide $SrRuO_3$ bottom electrode 17-2 and the amorphous $Pb(Zr_{0.48}Ti_{0.52})O_3$ thin film. During the subsequent rapid thermal annealing at the temperature of 600° C. for forming the $Pb(Zr_{0.48}Ti_{0.52})O_3$ thin dielectric film 18, the 5 at % Mg-containing amorphous strontium ruthenium oxide $SrRuO_3$ layer is crystallized to form the 5 at % Mg-containing strontium ruthenium oxide $SrRuO_3$ bottom electrode 17-2. Notwithstanding, the smooth interface between the 5 at % Mg-containing amorphous strontium ruthenium oxide SrRuO$_3$ layer and the Pb(Zr$_{0.48}$Ti$_{0.52}$)O$_3$ thin film has already been defined, for which reason the smooth interface can be obtained between the 5 at % Mg-containing strontium ruthenium oxide SrRuO$_3$ bottom electrode 17-2 and the Pb(Zr$_{0.48}$Ti$_{0.52}$)O$_3$ thin dielectric film 18. Further, the Pb(Zr$_{0.48}$Ti$_{0.52}$)O$_3$ thin dielectric film 18 is formed by the high temperature annealing, for which reason the Pb(Zr$_{0.48}$Ti$_{0.52}$)O$_3$ thin dielectric film 18 has a high dielectric constant. Thus, the above structure makes it possible to obtain both the required smooth interface between the bottom electrode and the dielectric film of the capacitor and the required high dielectric constant of the capacitor.

Figure 12:
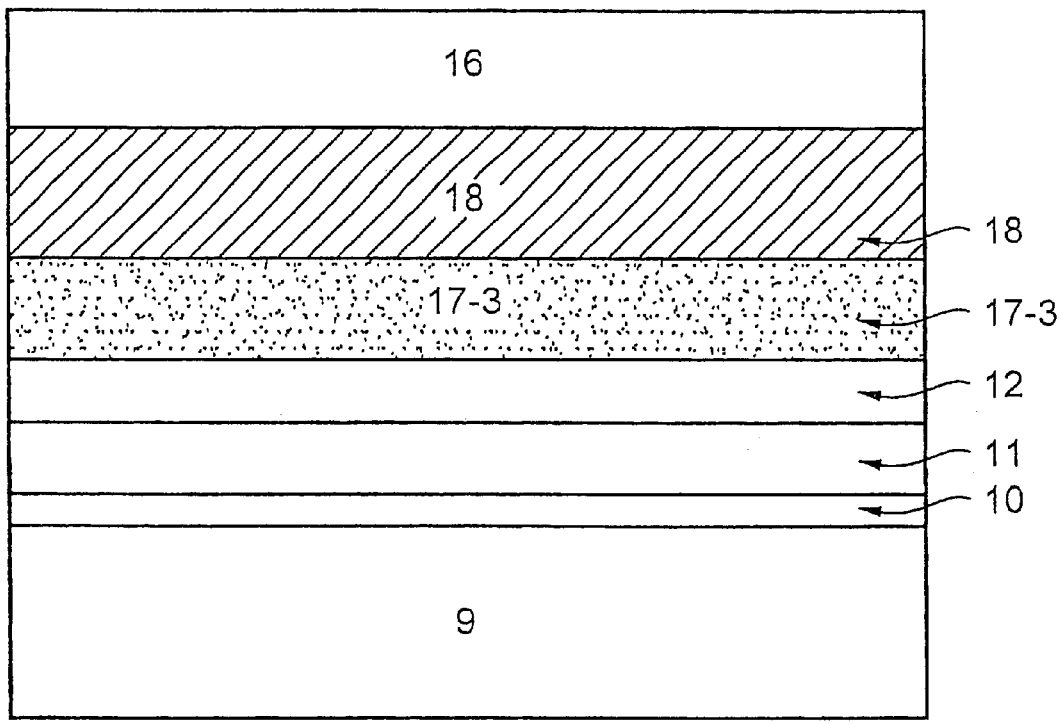
FIG. 12 is a fragmentary cross sectional elevation view illustrative of a first novel thin film capacitor having an improved bottom electrode formed over a semiconductor substrate for a semiconductor integrated circuit in a seventh embodiment in accordance with the present invention.

A seventh embodiment according to the present invention will be described in detail with reference to FIG. 12 which is a fragmentary cross sectional elevation view illustrative of a seventh novel thin film capacitor having an improved bottom electrode formed over a semiconductor substrate for a semiconductor integrated circuit. A TiSi$_2$ first diffusion barrier layer 10 is provided on a Si substrate 9. A TiN second diffusion barrier layer 11 is provided on the TiSi$_2$ first diffusion barrier layer 10. An Ru third diffusion barrier layer 12a is provided on the TiN second diffusion barrier layer 11. The Si substrate 9 is cooled at a temperature of −100° C. indirectly with a liquid nitrogen before an amorphous ruthenium oxide thin film is deposited on the Ru third diffusion barrier layer 12 by a reactive sputtering method using an Ar–75% O$_2$ mixture gas to form an amorphous Sr(Ru, Ir)O$_3$ layer on the Ru third diffusion barrier layer 12. A Pb(Zr$_{0.48}$Ti$_{0.52}$)O$_3$ thin film having a thickness of 200 nanometers is deposited on the amorphous Sr(Ru, Ir)O$_3$ layer by an RF-sputtering method at a temperature of 300° C., before the whereby a smooth interface with a small roughness is formed between the Pb(Zr$_{0.48}$Ti$_{0.52}$)O$_3$ thin film is subjected to a rapid thermal annealing in an oxygen atmosphere at a temperature of 600° C. for 30 seconds to cause a crystallization of the amorphous Sr(Ru, Ir)O$_3$ layer thereby to form an Sr(Ru, Ir)O$_3$ bottom electrode 17-3 and also to form a Pb(Zr$_{0.48}$Ti$_{0.52}$)O$_3$ thin dielectric film 18 on the Sr(Ru, Ir)O$_3$ bottom electrode 17-3. An Ru top electrode 16 is provided on the Pb(Zr$_{0.48}$Ti$_{0.52}$)O$_3$ thin dielectric film 18. During the deposition process of the Pb(Zr$_{0.48}$Ti$_{0.52}$)O$_3$ thin film at the temperature of 300° C., no crystallization is caused to the Sr(Ru, Ir)O$_3$ layer, for which reason the smooth surface of the Sr(Ru, Ir)O$_3$ layer remains unchanged, whereby the smooth interface can be obtained between the Sr(Ru, Ir)O$_3$ bottom electrode 17-3 and the amorphous Pb(Zr$_{0.48}$Ti$_{0.52}$)O$_3$ thin film. During the subsequent rapid thermal annealing at the temperature of 600° C. for forming the Pb(Zr$_{0.48}$Ti$_{0.52}$)O$_3$ thin dielectric film 18, the amorphous strontium Sr(Ru, Ir)O$_3$ layer is crystallized to form the Sr(Ru, Ir)O$_3$ bottom electrode 17-3. Notwithstanding, the smooth interface between the amorphous Sr(Ru, Ir)O$_3$ layer and the Pb(Zr$_{0.48}$Ti$_{0.52}$)O$_3$ thin film has already been defined, for which reason the smooth interface can be obtained between the Sr(Ru, Ir)O$_3$ bottom electrode 17-3 and the Pb(Zr$_{0.48}$Ti$_{0.52}$)O$_3$ thin dielectric film 18. Further, the Pb(Zr$_{0.48}$Ti$_{0.52}$)O$_3$ thin dielectric film 18 is formed by the high temperature annealing, for which reason the Pb(Zr$_{0.48}$Ti$_{0.52}$)O$_3$ thin dielectric film 18 has a high dielectric constant. Thus, the above structure makes it possible to obtain both the required smooth interface between the bottom electrode and the dielectric film of the capacitor and the required high dielectric constant of the capacitor.

Figure 13:
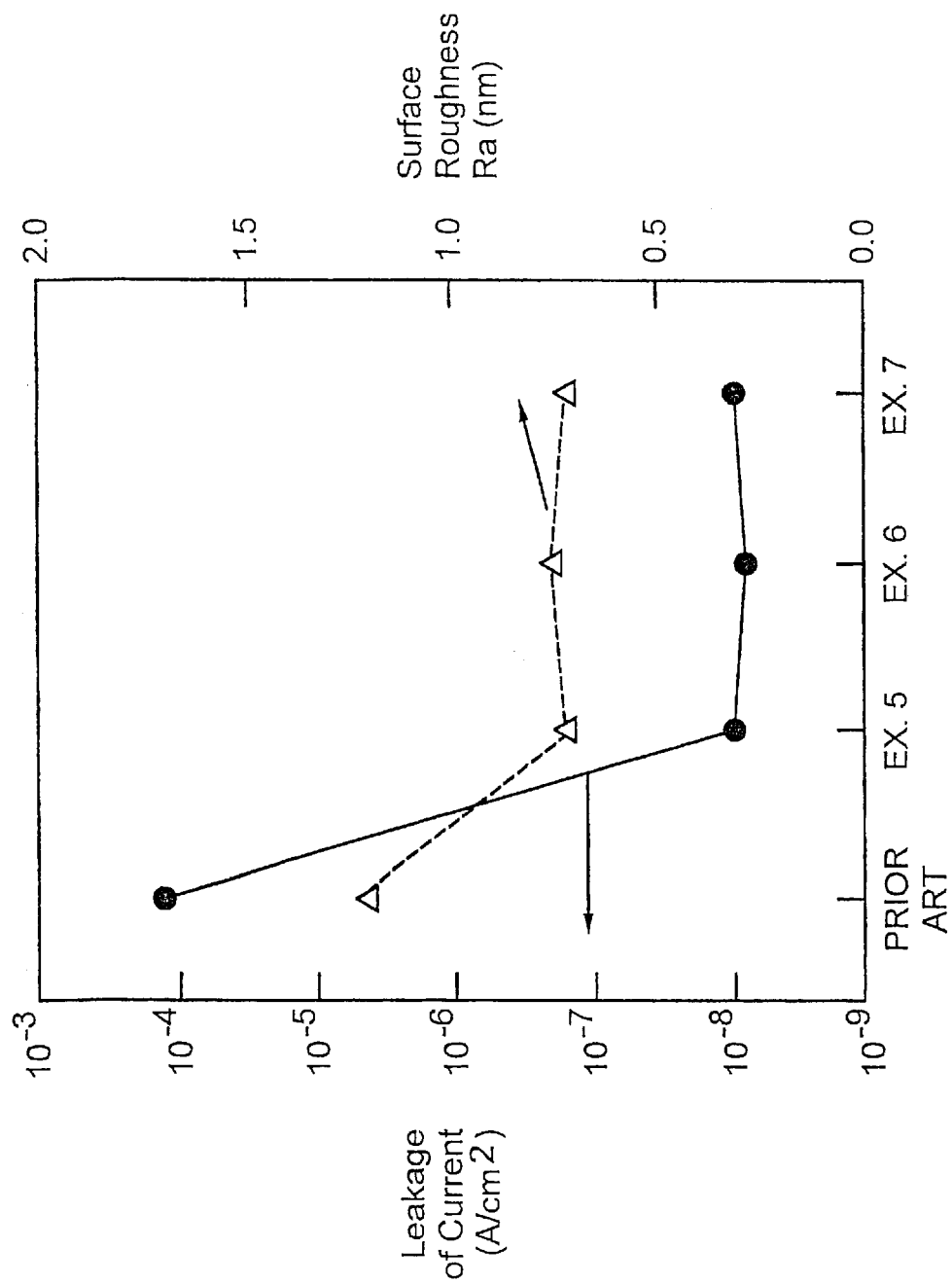
FIG. 13 is a diagram illustrative of leakage of currents and surface roughness for each of the conventional thin film capacitor, the fifth novel thin film capacitor having the $SrRuO_3$ bottom electrode in the fifth embodiment, the sixth novel thin film capacitor having the 5 at % Mg-containing $SrRuO_3$ bottom electrode in the sixth embodiment, and the seventh novel thin film capacitor having the $Sr(Ru, Ir)O_3$ bottom electrode in the seventh embodiment in accordance with the present invention.

FIG. 13 is a diagram illustrative of leakage of currents and surface roughness for each of the conventional thin film capacitor, the fifth novel thin film capacitor having the SrRuO$_3$ bottom electrode in the fifth embodiment, the sixth novel thin film capacitor having the 5 at % Mg-containing SrRuO$_3$ bottom electrode in the sixth embodiment, and the seventh novel thin film capacitor having the Sr(Ru, Ir)O$_3$ bottom electrode in the seventh embodiment, wherein ● represents the leakage of currents, whilst Δ represents the surface roughness. The conventional thin film capacitor has a surface roughness of about 1.2 nanometers and a leakage of current of about $1.3 \times 10^{-4}$ A/cm$^2$.

The fifth novel thin film capacitor having the SrRuO$_3$ bottom electrode in the fifth embodiment has a surface roughness of about 0.8 nanometers and a leakage of current of about $1.0 \times 10^{-8}$ A/cm$^2$. The bottom electrode has a relatively smooth surface with a reduced roughness, whereby the leakage of current is reduced. During the deposition process of the Pb(Zr$_{0.48}$Ti$_{0.52}$)O$_3$ thin film at the temperature of 300° C., no crystallization is caused to the amorphous strontium ruthenium oxide SrRuO$_3$ layer, for which reason the smooth surface of the amorphous strontium ruthenium oxide SrRuO$_3$ layer remains unchanged, whereby the smooth interface can be obtained between the amorphous strontium ruthenium oxide SrRuO$_3$ bottom electrode 17-1 and the amorphous Pb(Zr$_{0.48}$Ti$_{0.52}$)O$_3$ thin film. During the subsequent rapid thermal annealing at the temperature of 600° C. for forming the Pb(Zr$_{0.48}$Ti$_{0.52}$)O$_3$ thin dielectric film 18, the amorphous strontium ruthenium oxide SrRuO$_3$ layer is crystallized to form the strontium ruthenium oxide SrRuO$_3$ bottom electrode 17-1. Notwithstanding, the smooth interface between the amorphous strontium ruthenium oxide SrRuO$_3$ layer and the Pb(Zr$_{0.48}$Ti$_{0.52}$)O$_3$ thin film has already been defined, for which reason the smooth interface can be obtained between the strontium ruthenium oxide SrRuO$_3$ bottom electrode 17-1 and the Pb(Zr$_{0.48}$Ti$_{0.52}$)O$_3$ thin dielectric film 18. Further, the Pb(Zr$_{0.48}$Ti$_{0.52}$)O$_3$ thin dielectric film 18 is formed by the high temperature annealing, for which reason the Pb(Zr$_{0.48}$Ti$_{0.52}$)O$_3$ thin dielectric film 18 has a high dielectric constant. Thus, the above structure makes it possible to obtain both the required smooth interface between the bottom electrode and the dielectric film of the capacitor and the required high dielectric constant of the capacitor.

The sixth novel thin film capacitor having the 5 at % Mg-containing SrRuO$_3$ bottom electrode in the sixth embodiment has a surface roughness of about 0.8 nanometers and a leakage of current of about $9.0 \times 10^{-9}$ A/cm$^2$. The bottom electrode has a relatively smooth surface with a reduced roughness, whereby the leakage of current is reduced. During the deposition process of the Pb(Zr$_{0.48}$Ti$_{0.52}$)O$_3$ thin film at the temperature of 300° C., no crystallization is caused to the 5 at % Mg-containing amorphous strontium ruthenium oxide SrRuO$_3$ layer, for which reason the smooth surface of the 5 at % Mg-containing amorphous strontium ruthenium oxide SrRuO$_3$ layer remains unchanged, whereby the smooth interface can be obtained between the 5 at % Mg-containing amorphous strontium ruthenium oxide SrRuO$_3$ bottom electrode 17-2 and the amorphous Pb(Zr$_{0.48}$Ti$_{0.52}$)O$_3$ thin film. During the subsequent rapid thermal annealing at the temperature of 600° C. for forming the Pb(Zr$_{0.48}$Ti$_{0.52}$)O$_3$ thin dielectric film 18, the 5 at % Mg-containing amorphous strontium ruthenium oxide SrRuO$_3$ layer is crystallized to form the 5 at % Mg-containing strontium ruthenium oxide SrRuO$_3$ bottom electrode 17-2. Notwithstanding, the smooth interface between the 5 at % Mg-containing amorphous strontium ruthenium oxide SrRuO$_3$ layer and the Pb(Zr$_{0.48}$Ti$_{0.52}$)O$_3$ thin film has already been defined, for which reason the smooth interface can be obtained between the 5 at %

Mg-containing strontium ruthenium oxide SrRuO$_3$ bottom electrode 17-2 and the Pb(Zr$_{0.48}$Ti$_{0.52}$)O$_3$ thin dielectric film 18. Further, the Pb(Zr$_{0.48}$Ti$_{0.52}$)O$_3$ thin dielectric film 18 is formed by the high temperature annealing, for which reason the Pb(Zr$_{0.48}$Ti$_{0.52}$)O$_3$ thin dielectric film 18 has a high dielectric constant. Thus, the above structure makes it possible to obtain both the required smooth interface between the bottom electrode and the dielectric film of the capacitor and the required high dielectric constant of the capacitor.

The seventh novel thin film capacitor having the Sr(Ru, Ir)O$_3$ bottom electrode in the seventh embodiment has a surface roughness of about 0.8 nanometers and a leakage of current of about $9.5 \times 10^{-9}$ A/cm$^2$. The bottom electrode has a relatively smooth surface with a reduced roughness, whereby the leakage of current is reduced. During the deposition process of the Pb(Zr$_{0.48}$Ti$_{0.52}$)O$_3$ thin film at the temperature of 300° C., no crystallization is caused to the Sr(Ru, Ir)O$_3$ layer, for which reason the smooth surface of the Sr(Ru, Ir)O$_3$ layer remains unchanged, whereby the smooth interface can be obtained between the Sr(Ru, Ir)O$_3$ bottom electrode 17-3 and the amorphous Pb(Zr$_{0.48}$Ti$_{0.52}$)O$_3$ thin film. During the subsequent rapid thermal annealing at the temperature of 600° C. for forming the Pb(Zr$_{0.48}$Ti$_{0.52}$)O$_3$ thin dielectric film 18, the amorphous strontium Sr(Ru, Ir)O$_3$ layer is crystallized to form the Sr(Ru, Ir)O$_3$ bottom electrode 17-3. Notwithstanding, the smooth interface between the amorphous Sr(Ru, Ir)O$_3$ layer and the Pb(Zr$_{0.48}$Ti$_{0.52}$)O$_3$ thin film has already been defined, for which reason the smooth interface can be obtained between the Sr(Ru, Ir)O$_3$ bottom electrode 17-3 and the Pb(Zr$_{0.48}$Ti$_{0.52}$)O$_3$ thin dielectric film 18. Further, the Pb(Zr$_{0.48}$Ti$_{0.52}$)O$_3$ thin dielectric film 18 is formed by the high temperature annealing, for which reason the Pb(Zr$_{0.48}$Ti$_{0.52}$)O$_3$ thin dielectric film 18 has a high dielectric constant. Thus, the above structure makes it possible to obtain both the required smooth interface between the bottom electrode and the dielectric film of the capacitor and the required high dielectric constant of the capacitor.

Eighth Embodiment

Figure 14:
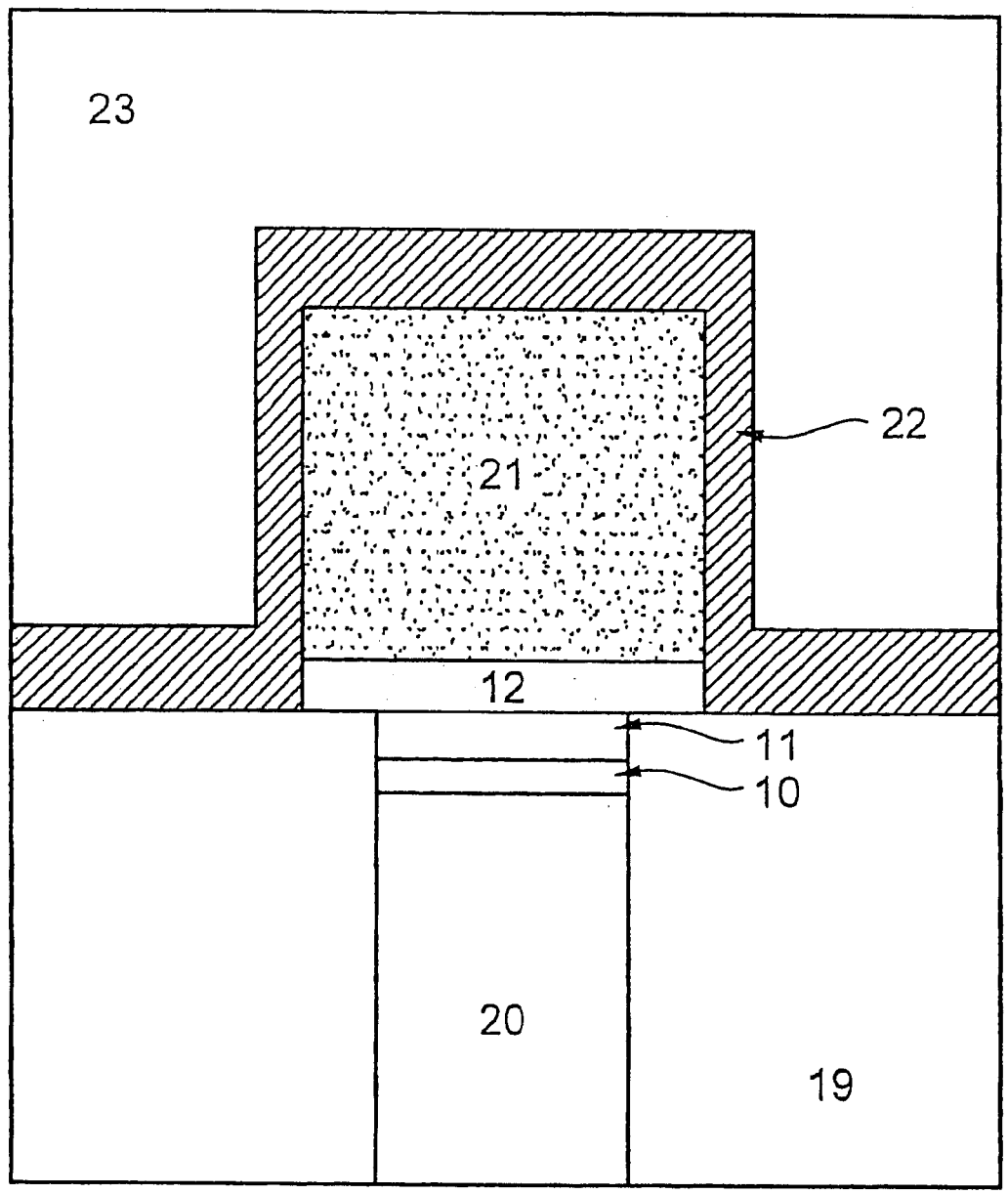
FIG. 14 is a fragmentary cross sectional elevation view illustrative of an eighth novel thin film capacitor having an improved bottom electrode formed over an interlayer insulator for a semiconductor integrated circuit in the eighth embodiment in accordance with the present invention.

An eighth embodiment according to the present invention will be described in detail with reference to FIG. 14 which is a fragmentary cross sectional elevation view illustrative of an eighth novel thin film capacitor having an improved bottom electrode formed over an interlayer insulator for a semiconductor integrated circuit. An SiO$_2$ interlayer insulator 19 having a thickness of 600 nanometers has a contact hole, within which a contact plug is provided, wherein the contact plug comprises laminations of a phosphorus-doped polysilicon film 20, a titanium silicide layer 10 and a titanium nitride layer 11. An Ru film 12 having a thickness of 50 nanometers is deposited on a selected region of the SiO$_2$ interlayer insulator 19 by a sputtering method at a substrate temperature of 200 ° C., so that the Ru film 12 extends over the titanium nitride layer 11 and the SiO$_2$ interlayer insulator 19 in the vicinity of the contact hole. An RuO$_2$ bottom electrode 21 as a storage electrode is selectively provided on the Ru film 12 by a sputtering method at a substrate temperature of 250° C. with an irradiation, wherein the RuO$_2$ bottom electrode 21 has a thickness of 200 nanometers. The RuO$_2$ bottom electrode 21 may be patterned as follows. After an RuO$_2$ layer has been deposited, a spin-on-glass etching mask is formed on the RuO$_2$ layer by use of a photo-lithography technique. An electron cyclotron resonance plasma etching is carried out using a mixture gas of Cl$_2$ and O$_2$ to pattern the RuO$_2$ layer thereby forming the RuO$_2$ bottom electrode 21. An electron cyclotron resonance metal organic chemical vapor deposition method is carried out using Ba(DPM)$_2$, Sr(DPM)$_2$, Ti(i-OC$_3$H$_7$) and oxygen gas as source gases at a substrate temperature of 500° C. to entirely deposit a (Ba$_{0.5}$Sr$_{0.5}$)TiO$_3$ thin dielectric film 22 having a thickness of 30 nanometers on the top and side walls of the RuO$_2$ bottom electrode 21 and on the SiO$_2$ interlayer insulator 19 outside the RuO$_2$ bottom electrode 21. An Ru plate electrode 23 serving as a top electrode and having a thickness of 500 nanometers deposited on the(Ba$_{0.5}$Sr$_{0.5}$)TiO$_3$ thin dielectric film 22 by a sputtering method. The bottom electrode is deposited with an ion-irradiation such as phosphorus ion irradiation. The ion-irradiation onto the crystal growing surface etches the crystal growing surface but at a lower etching rate than the crystal growth rate. Normally, a crystalline conductive oxide is deposited by growing top-tapered and pillar-shaped crystal structures. This increases a surface roughness of the conductive oxide bottom electrode. Further, the growth of the crystalline conductive oxide on the polycrystalline layer emphasizes the surface roughness. However, in accordance with the above novel method, the ion-irradiation onto the crystal growing surface is carried out to etch the tapered tops of the pillar-shaped crystal structures, whereby the surface roughness of the crystal growing surface is made smooth. This allows the conductive oxide bottom electrode may have a smooth surface. Further, the conductive oxide bottom electrode has already comprised a crystal before the deposition process of the dielectric film at the high substrate temperature, for which reason no change in shape of the surface of the conductive oxide bottom electrode is caused during the high temperature deposition process for the dielectric film.

Figure 15:
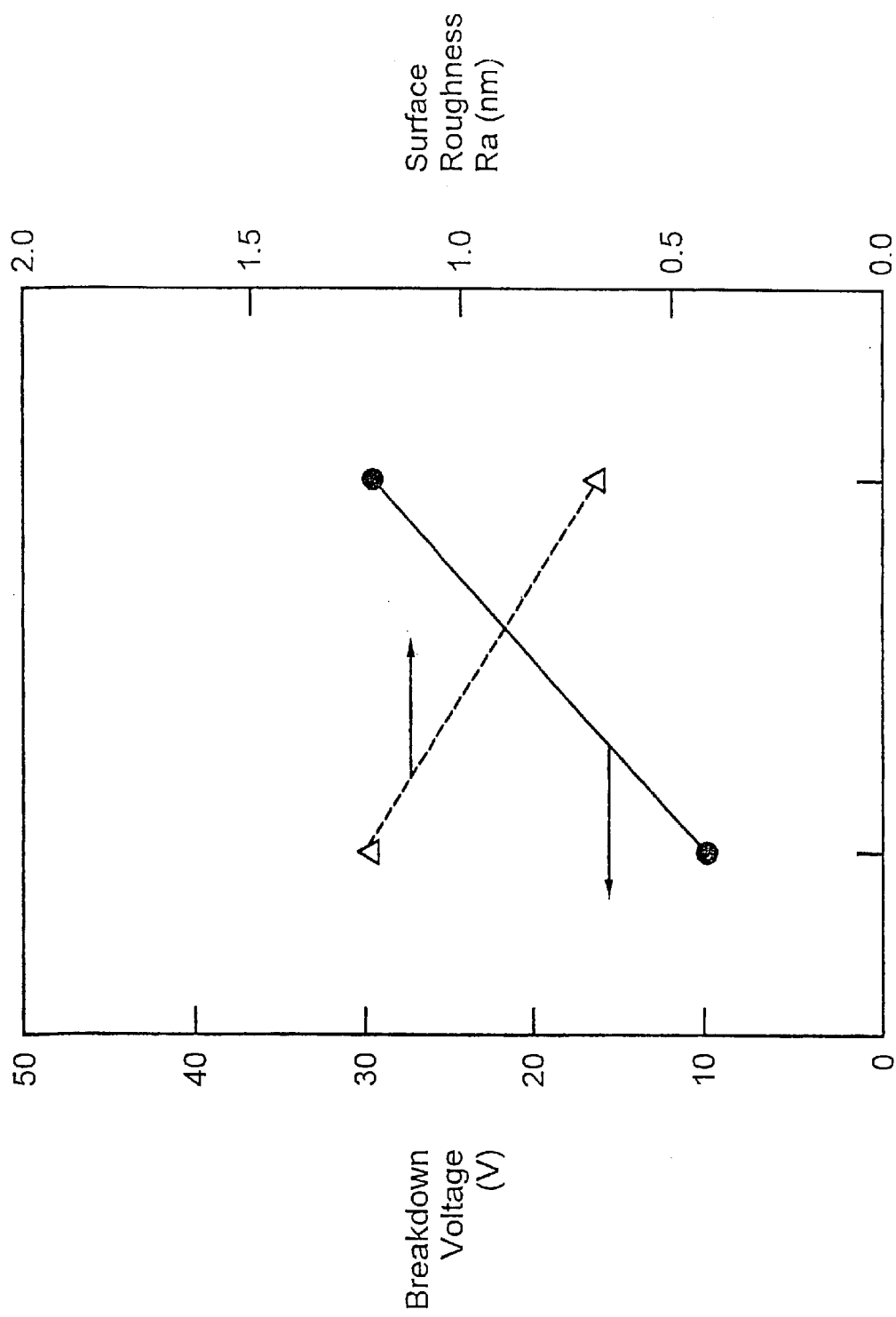
FIG. 15 is a diagram illustrative of breakdown voltages and surface roughness for each of the conventional thin film capacitor and the eighth novel thin film capacitor having the crystalline ruthenium oxide bottom electrode in the eighth embodiment in accordance with the present invention.

FIG. 15 is a diagram illustrative of breakdown voltages and surface roughness for each of the conventional thin film capacitor and the eighth novel thin film capacitor having the crystalline ruthenium oxide bottom electrode in the eighth embodiment wherein ● represents the breakdown voltage, whilst Δ represents the surface roughness. The conventional thin film capacitor has a surface roughness of about 1.2 nanometers and a breakdown voltage of about 10V.

The eighth novel thin film capacitor having the crystalline ruthenium oxide bottom electrode in the eighth embodiment has a surface roughness of about 0.7 nanometers and a breakdown voltage of about 30V. The reduction in surface roughness of the bottom electrode causes an improvement in the breakdown voltage thereof.

The bottom electrode may comprise an oxide represented by a chemical formula ABO$_3$, where A is at least an element selected from the group consisting of Ba, Sr, Pb, Ca, La, Li and K; B is at least an element selected from the group consisting of Zr, Ti, Ta, Nb, Mg, Mn, Fe, Zn and W. Alternatively, the bottom electrode may comprise an oxide represented by a chemical formula (Bi$_2$O$_2$)A$_{m-1}$B$_m$O$_{3m+1}$ (m=1, 2, 3, 4, 5), where A is at least an element selected from the group consisting of Ba, Sr, Pb, Ca, K and Bi; B is at least an element selected from the group consisting of Ti, Ta, Nb and W.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A storage electrode of a capacitor, said storage electrode including a region in contact with a dielectric film of said capacitor, wherein at least said region is made of an amorphous electrically conductive oxide material.

2. The storage electrode as claimed in claim 1, wherein an entire lower storage electrode is made of an amorphous electrically conductive oxide material.

3. The storage electrode as claimed in claim 1, wherein said amorphous electrically conductive oxide material comprises an oxide of at least a metal selected from the group consisting of Ru, Ir, Os, Re and Rh.

4. The storage electrode as claimed in claim 1, wherein said amorphous electrically conductive oxide material comprises a material represented by a chemical formula of $ABO_3$, where A is at least an element selected from the group consisting of Ba, Sr, Pb, Ca, La, Li and K; and B is at least an element selected from the group consisting of Zr, Ti, Ta, Nb, Mg, Mn, Fe, Zn and W.

5. The storage electrode as claimed in claim 1, wherein said amorphous electrically conductive oxide material comprises an oxygen deficiency of a material represented by a chemical formula of $ABO_3$, where A is at least an element selected from the group consisting of Ba, Sr, Pb, Ca, La, Li and K; and B is at least an element selected from the group consisting of Zr, Ti, Ta, Nb, Mg, Mn, Fe, Zn and W.

6. The storage electrode as claimed in claim 1, wherein said amorphous electrically conductive oxide material comprises a material represented by a chemical formula of $A_2BO_4$, where A is at least an element selected from the group consisting of Ba, Sr, Pb, Ca, La, Li and K; and B is at least an element selected from the group consisting of Zr, Ti, Ta, Nb, Mg, Mn, Fe, Zn and W.

7. The storage electrode as claimed in claim 1, wherein said amorphous electrically conductive oxide material comprises an oxygen deficiency of a material represented by a chemical formula of $A_2BO_4$, where A is at least an element selected from the group consisting of Ba, Sr, Pb, Ca, La, Li and K; and B is at least an element selected from the group consisting of Zr, Ti, Ta, Nb, Mg, Mn, Fe, Zn and W.

8. The storage electrode as claimed in claim 1, wherein said amorphous electrically conductive oxide material comprises a material represented by a chemical formula of $A_2B_2O_7$, where A is at least an element selected from the group consisting of Ba, Sr, Pb, Ca, La, Li and K; and B is at least an element selected from the group consisting of Zr, Ti, Ta, Nb, Mg, Mn, Fe, Zn and W.

9. The storage electrode as claimed in claim 1, wherein said amorphous electrically conductive oxide material comprises an oxygen deficiency of a material represented by a chemical formula of $A_2B_2O_7$, where A is at least an element selected from the group consisting of Ba, Sr, Pb, Ca, La, Li and K; and B is at least an element selected from the group consisting of Zr, Ti, Ta, Nb, Mg, Mn, Fe, Zn and W.

10. The storage electrode as claimed in claim 1, wherein said amorphous electrically conductive oxide material comprises a material represented by a chemical formula $(Bi_2O_2)A_{m-1}B_mO_{3m+1}$ (m=1, 2, 3, 4, 5), where A is at least an element selected from the group consisting of Ba, Sr, Pb, Ca, K and Bi; and B is at least an element selected from the group consisting of Ti, Ta, Nb and W.

11. The storage electrode as claimed in claim 1, wherein said amorphous electrically conductive oxide material comprises an oxygen deficiency of a material represented by a chemical formula $(Bi_2O_2)A_{m-1}B_mO_{3m+1}$ (m=1, 2, 3, 4, 5), where A is at least an element selected from the group consisting of Ba, Sr, Pb, Ca, K and Bi; and B is at least an element selected from the group consisting of Ti, Ta, Nb and W.

12. The storage electrode as claimed in claim 1, wherein said amorphous electrically conductive oxide material is doped with at least a refractory metal.

13. The storage electrode as claimed in claim 12, wherein said refractory metal is doped in the range of 1–10 at %.

14. The storage electrode as claimed in claim 1, wherein an entire storage electrode is made of an electrically conductive oxide material of at least a metal selected from the group consisting of Ru, Ir, Os, Re and Rh.

15. The storage electrode as claimed in claim 1, wherein said electrically conductive oxide material is doped with at least a refractory metal.

16. The storage electrode as claimed in claim 15, wherein said refractory metal is doped in the range of 1–10 at %.

17. The storage electrode of claim 1, wherein said region has a surface in contact with the dielectric film, the surface having a surface roughness of no more than 0.8 nanometers.

* * * * *